United States Patent
Lin et al.

(10) Patent No.: US 10,575,022 B2
(45) Date of Patent: Feb. 25, 2020

(54) IMAGE ENCODING AND DECODING METHOD, IMAGE PROCESSING DEVICE AND COMPUTER STORAGE MEDIUM

(71) Applicants: TONGJI UNIVERSITY, Shanghai (CN); ZTE Corporation, Shenzhen (CN)

(72) Inventors: Tao Lin, Shanghai (CN); Ming Li, Shenzhen (CN); Ping Wu, Shenzhen (CN); Guoqiang Shang, Shenzhen (CN); Zhao Wu, Shenzhen (CN)

(73) Assignees: ZTE Corporation, Shenzhen, Guangdong (CN); TONGJI University, Shanghai (CN)

( * ) Notice: Subject to any disclaimer, the term of this patent is extended or adjusted under 35 U.S.C. 154(b) by 0 days.

(21) Appl. No.: 15/580,716

(22) PCT Filed: Jun. 6, 2016

(86) PCT No.: PCT/CN2016/085010
§ 371 (c)(1),
(2) Date: Dec. 8, 2017

(87) PCT Pub. No.: WO2016/197898
PCT Pub. Date: Dec. 15, 2016

(65) Prior Publication Data
US 2018/0205971 A1 Jul. 19, 2018

(30) Foreign Application Priority Data

Jun. 9, 2015 (CN) .......................... 2015 1 0310951
May 27, 2016 (CN) .......................... 2016 1 0363506

(51) Int. Cl.
*H04N 19/93* (2014.01)
*H04N 19/91* (2014.01)
(Continued)

(52) U.S. Cl.
CPC .............. *H04N 19/91* (2014.11); *H03M 7/40* (2013.01); *H04N 19/13* (2014.11);
(Continued)

(58) Field of Classification Search
CPC ...... H04N 19/91; H04N 19/96; H04N 19/184; H04N 19/182; H04N 19/593; H04N 19/13; H04N 19/157; H03M 7/40; H03M 13/27
See application file for complete search history.

(56) References Cited

U.S. PATENT DOCUMENTS 5,218,431 A * 6/1993 Gleicher .............. H04N 11/042
345/473
5,485,600 A * 1/1996 Joseph ...................... G06F 8/34
345/473

(Continued)

FOREIGN PATENT DOCUMENTS

CN 101511024 A 8/2009
CN 101888556 A 11/2010
(Continued)

OTHER PUBLICATIONS

Sze et al. (High Efficiency Video Coding—Springer—2014 (Year: 2014).*

(Continued)

*Primary Examiner* — Philip P. Dang
(74) *Attorney, Agent, or Firm* — Cooper Legal Group, LLC

(57) ABSTRACT

Disclosed are an image encoding and decoding method, image processing device, and computer storage medium, comprising: entropy-encoding a plurality of replication parameters of a current encoding block according to their order after adjustment, to generate a video code stream comprising information of the plurality of replication param- (Continued)

eters; said plurality of replication parameters comprising one or more types of replication parameter components. Parsing the video code stream, comprising the information of the plurality of replication parameters, of a decoding block; entropy-decoding said plurality of replication parameters to obtain binary code of said plurality of replication parameters; adjusting said binary code to obtain the values of said plurality of replication parameters; said plurality of replication parameters comprising one or more types of replication parameter components.

18 Claims, 12 Drawing Sheets

(51) Int. Cl.
| | | |
|---|---|---|
| H04N 19/157 | (2014.01) | |
| H03M 7/40 | (2006.01) | |
| H04N 19/13 | (2014.01) | |
| H04N 19/593 | (2014.01) | |
| H04N 19/182 | (2014.01) | |
| H04N 19/184 | (2014.01) | |
| H04N 19/96 | (2014.01) | |
| H03M 13/27 | (2006.01) | |

(52) U.S. Cl.
CPC ......... *H04N 19/157* (2014.11); *H04N 19/182* (2014.11); *H04N 19/184* (2014.11); *H04N 19/593* (2014.11); *H04N 19/96* (2014.11); *H03M 13/27* (2013.01)

(56) References Cited

U.S. PATENT DOCUMENTS

| | | | | | |
|---|---|---|---|---|---|
| 5,832,297 | A * | 11/1998 | Ramagopal | ......... | G06F 9/30047 710/5 |
| 6,069,707 | A * | 5/2000 | Pekelman | .......... | H04N 1/00278 358/1.13 |
| 6,108,715 | A * | 8/2000 | Leach | ...................... | G06F 9/547 709/203 |
| 6,377,712 | B1 * | 4/2002 | Georgiev | ................ | G06T 13/80 345/619 |
| 6,481,006 | B1 * | 11/2002 | Blandy | ................... | G06F 9/449 717/139 |
| 6,829,769 | B2 * | 12/2004 | Cranston | ................. | G06F 9/544 711/209 |
| 6,874,148 | B1 * | 3/2005 | Richardson | ........... | G06F 9/4486 719/328 |
| 7,143,032 | B2 * | 11/2006 | Chen | ..................... | G10L 19/005 704/228 |
| 7,174,534 | B2 * | 2/2007 | Chong | ..................... | G06F 8/20 370/352 |
| 7,308,406 | B2 * | 12/2007 | Chen | ..................... | G10L 19/005 704/219 |
| 7,404,193 | B2 * | 7/2008 | Hen | ......................... | G06F 9/547 710/10 |
| 7,590,525 | B2 * | 9/2009 | Chen | ..................... | G10L 19/005 704/211 |
| 7,624,398 | B2 * | 11/2009 | Wang | ...................... | G06F 9/547 719/313 |
| 7,711,563 | B2 * | 5/2010 | Chen | ..................... | G10L 19/005 704/223 |
| 8,787,447 | B2 | 7/2014 | Ramachandran | | |
| 9,112,928 | B2 * | 8/2015 | Lindberg | .................. | G06F 8/61 |
| 9,329,865 | B2 * | 5/2016 | Combs | ................ | G06F 9/30054 |
| 9,602,465 | B2 * | 3/2017 | Jain | ..................... | H04L 61/2567 |
| 9,674,715 | B2 * | 6/2017 | Ryan | .................... | H04L 41/0816 |
| 9,959,429 | B2 * | 5/2018 | Jaffe | ........................ | G06F 21/72 |
| 10,165,246 | B2 * | 12/2018 | Buerkle | .................. | B60R 1/002 |
| 2007/0201430 | A1 * | 8/2007 | Holmstrom | ....... | H04L 29/06027 370/352 |
| 2010/0111162 | A1 | 5/2010 | Ramachandran | | |
| 2013/0083851 | A1 * | 4/2013 | Alshin | ................. | H04N 19/577 375/240.14 |
| 2013/0204450 | A1 * | 8/2013 | Kagan | ..................... | H04L 67/06 700/291 |
| 2013/0268598 | A1 * | 10/2013 | Tipirneni | ................ | G06F 3/011 709/204 |
| 2014/0359656 | A1 * | 12/2014 | Banica | .................. | H04N 21/812 725/32 |
| 2015/0065106 | A1 * | 3/2015 | Catovic | ................... | H04W 8/22 455/418 |
| 2015/0350671 | A1 * | 12/2015 | Alshin | ................. | H04N 19/105 375/240.15 |
| 2016/0078361 | A1 * | 3/2016 | Brueckner | .............. | H04L 67/10 706/12 |
| 2016/0260428 | A1 * | 9/2016 | Matsuda | .................. | G06N 3/08 |
| 2016/0330455 | A1 * | 11/2016 | Lin | ...................... | H04N 19/503 |
| 2017/0006285 | A1 * | 1/2017 | Lin | ...................... | H04N 19/176 |
| 2017/0127090 | A1 * | 5/2017 | Rosewarne | ............ | H04N 19/86 |
| 2017/0180737 | A1 * | 6/2017 | Ye | .......................... | H04N 19/70 |

FOREIGN PATENT DOCUMENTS

| | | |
|---|---|---|
| CN | 103765887 A | 4/2014 |
| CN | 104378644 A | 2/2015 |
| CN | 104641640 A | 5/2015 |
| CN | 104683805 A | 6/2015 |
| EP | 1929782 A1 | 6/2008 |
| EP | 3035683 A1 | 6/2016 |
| WO | 2015021942 A1 | 2/2015 |

OTHER PUBLICATIONS

International Search Report in international application No. PCT/CN2016/085010, dated Aug. 26, 2016, 2 pgs.

English Translation of the Written Opinion of the International Search Authority in international application No. PCT/CN2016/085010, dated Aug. 26, 2016, 6 pgs.

Supplementary European Search Report in European application No. 16806796.5, dated May 3, 2018, 14 pgs.

"High Efficiency Video Coding (HEVC): Algorithms and Architectures—Chapter 8: Entropy Coding in HEVC" In: "High Efficiency Video Coding (HEVC)", Jan. 1, 2014, Vivienne Sze and Detlev Marpe, Springer International Publishing, XP055263413 , ISBN: 978-3-319-06894-7, DOI : 10.1007/ 978-3-319-06895-4 8, * sections 2.3.2, 3.3.2, 5.1.2, 8.2.2 *. 67 pgs.

"Non CE1: Grouping Palette Indices At Front", Feb. 2015, Marta Karczewicz, Wei Pu and Rajan Joshi, 20th JCT-VC Meeting; Geneva; (Joint Collaborative Team on Video Coding of ISO/ IEC JTC1/ SC29/ WG11 and ITU-TSG.16); Document JCTVT-T0065r2, URL: http://wftp3.itu.int/av-arch/jctvc-site/, No. JCTVC-T0065-v5, 3 pgs.

"Non-CE6: Intra-mode bypass parallelism (IMBP)", C. Rosewarne, Feb. 2012, 8th JCT-VC Meeting; 99. MPEG Meeting; (Joint Collaborative Team on Video Coding of ISO/IEC JTC1/SC29/WG11 and ITU-T SG. 16); URL: http://wftp3.itu.int/av-arch/jctvc-site/, No. JCTVC-H0244, 16 pgs.

"Modified MVD coding for CABAC", Jul. 2011, Hisao Sasan, 6th JCT-VC Meeting; 97. MPEG Meeting; T0rin0; (Joint Collaborative Team on Video Coding of ISO/IEC JTC1/SC29/WG11 and ITU-T SG.16 ); URL: http://wftp3.itu.int/av-arch/jctvc-site/, No. JCTVC-F423, 4 pgs.

"CE3: results of test B.1 and test B.7", Feb. 2015, Bin Li, 20th JCT-VC Meeting; Geneva; (Joint Collaborative Team on Video Coding of ISO/IEC JTC1/SC29/WG11 and ITU-TSG. 16 ); URL: http://wftp3.itu.int/ av-arch/jctvc-site/, No . JCTVC-T0041, 18 pgs.

"High Efficiency Video Coding (HEVC) Screen Content Coding: Draft 2", Jun. 2014, Rajan Joshi, Joint Collaborative Team on Video Coding (JCT-VC) of ITU-T SG 16 WP 3 and ISO/IECJTC 1, 200 pgs.

"Intra mode coding for INTRA_NxN", Apr. 2012, Wei-Jong Chien Jianic Chen and M. Conan, 9th JCT-VC Meeting; 100. MPEG

(56) References Cited

OTHER PUBLICATIONS

Meeting; Geneva; (J0int Collaborative Team on Video Coding of ISO/IEC JTC1/SC29/WG11 and ITU-T SG.16 ); URL: http: //wftp3. itu. int/av-arch/jctvc-site/, 5 pgs.
"Non-CE10: Improvement on coding of ISC parameters and comparison to Palette Coding", Oct. 2014, Kailun Zhou, Liping Zhao and Xianyi Chen, 19th JCT-VC Meeting; Strasbourg; (J0int Collaborative Team on Video Coding of IS0/IEC JTC1/SC29/WG11 and ITU-T SG.16 ); URL: http: //wftp3. itu. int/av -arch/ jctvc-site/, 6 pgs.
"Screen content coding using non-square intra block copy for HEVC", Jul. 2014, Chun-Chi Chen, Xiaozhong Xu, Ru-Ling Liao, Wen-Hsia Peng, Shan Liu and Shawmin Lei,2014 IEEE International Conference on Multimedia and Expo (ICME), IEEE, pp. 1-6.
"Advanced Screen Content Coding Using Color Table and Index Map", Oct. 2014, Zhan Ma, Wei Wang and Haoping Tu, IEEE Transactions on Image Processing , IEEE Service Center, Piscataway, NJ, US, vol. 23, No. 10, 14 pgs.
"Palette-Based Coding on the Screen Content Coding Extension of the HEVC Standard", Apr. 2015, Xiaoyu Xiu, Yuwen He, Rajan Joshi, Marta Karezewicz, Patrice Chrisyophe Giswutt and Giillanme Laroche. 2O15 Data Compression Conference, 10 pgs.
First Chinese Office Action, CN Application No. 20161036506.8 dated Oct. 8, 2019, 18 pgs.
"Non CE1 : Grouping Plaette Indices At Front"; Feb. 2015; Marta Karczewicz, Wei Pu, Rajan Joshi; Joint Collaborative Team on Video Coding (JCT-VC) of ITU-T SG 16 WP 3 and ISO/IEC JTC 1/SC 29/WG 11, Document: JCTVC-T0065r2, 3 pgs.
"High Efficiency Video Coding (HEVC) Screen Content Coding: Draft 12", Jul. 2014; Rajan Joshi and Jizheng Xu; Joint Collaborative Team on Video Coding (JCT-VC) of ITU-T SG 16 WP 3 and ISO/IEC JTC 1/SC 29/WG11; Document JCTVC-SR1005, 1 pg.
"Modified MVD Coding for CABAC"; Jul. 2011; Hisao Sasaj,Takahio Nishi; Joint Collaborative Team on Video Coding (JCT-VC) of ITU-T SG 16 WP 3 and ISO/IEC JTC 1/SC 291WG 11, Document: JCTVC-F423, 6 pgs.
"Intra-Mode Bypass Parallelism(IMBP)", Feb. 2012; C. Rosewarne; Joint Collaborative Team on Video Coding (JCT-VC) of ITU-T SG 16 WP 3 and ISO/IEC JTC 1/SC 29/WG 11, Document: JCTVC-H0244, 1 pg.
"CE3: Results of test B.1 and test Bi"; Feb. 2015; Bin Li; Joint Collaborative Team on Video Coding (JCT-VC) of ITU-T SG 16 WP 3 and ISO/IEC JTC 1/SC 291WG 11, Document: JCTVC-T0041, 1 pg.

\* cited by examiner perform entropy coding on multiple copying parameters according to
an order of the copying parameters resulted from division,
classification and reorganization for placement in a bitstream $\underbrace{\text{At a starting part of the bitstream, a copying parameter part with a context model (CM) and a copying parameter part without the CM}}$ A bitstream of a coding/decoding block
(a)

$\underbrace{\text{A part with the CM of a copying parameter A, a part with the CM of a copying parameter B, ......, and more parts with the CM}}$ copying parameter parts with the CM in the bitstream of the coding/decoding block $\underbrace{\text{A part without the CM of a copying parameter A, a part without the CM of a copying parameter B, ......, and more parts without the CM}}$ Copying parameter parts without the CM in the
bitstream of the coding/decoding block
(b)

$\underbrace{A_{11},... A_{12},... A_{1i},... A_{k1},A_{k2},... A_{ki},... B_{11},B_{12},... B_{1m},... B_{k1},B_{k2},... B_{km},... \text{, More bits with the CM}}$ Copying parameter parts with the CM in the bitstream of the coding/decoding block $\underbrace{A_{1(i+1)},... A_{1j},... A_{k(i+1)},... A_{kj},... ,B_{1(m+1)},... B_{1n},... ,B_{k(m+1)},... B_{kn},... \text{, More parts without the CM}}$ Copying parameter parts without the CM in the
bitstream of the coding/decoding block
(c)

$\underbrace{A_{11},... A_{21},... A_{k1},... A_{1i},A_{2i},... A_{ki},... B_{11},B_{21},... B_{k1},... B_{1m},B_{2m},... B_{km},... \text{, More bits with the CM}}$ Copying parameter parts with the CM in the bitstream of the coding/decoding block $\underbrace{A_{1(i+1)},... A_{k(i+1)},... ... A_{1j},... A_{kj},... ,B_{1(m+1)},... ,B_{k(m+1)},... ... B_{1n},... B_{kn},... \text{, More parts without the CM}}$ Copying parameter parts without the CM in the
bitstream of the coding/decoding block
(d)

FIG. 1

201 divide the plurality of the copying parameters into N subparts according to a predetermined rule, N≥2, wherein each of the N subparts of the plurality of the copying parameters is null or non-null

classify, merge and re-sequence same subparts of the plurality of the copying parameters; and then perform the entropy coding on the same subparts sequentially

FIG. 2B

201 divide the plurality of the copying parameters into N subparts according to a predetermined rule, N≥2, wherein each of the N subparts of the plurality of the copying parameters is null or non-null

classify, merge and re-sequence same subparts of the plurality of the copying parameters; and then perform the entropy coding on the same subparts sequentially

divide the plurality of the copying parameters into bin parts with a CM and bin parts without the CM

FIG. 2C parsing a video bitstream including a plurality of copying parameters of a decoding block, wherein the plurality of the copying parameters include one or more types of the copying parameter components, and wherein the one or more types of copying parameter components includes at least one of a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length, or an unmatched pixel — 301 perform an entropy decoding on the plurality of the copying parameters to obtain bins of the plurality of the copying parameters, and
perform a regulation operation on the bins to obtain values of the plurality of the copying parameters — 302

FIG. 3A

302 divide the bins into N subparts according to a predetermined rule, N≥2, wherein each of the N subparts of the plurality of the copying parameters is null or non-null classify, merge and map bins in the N subparts of the bins into reconstructed values of the plurality of the copying parameters

FIG. 3B divide the bins into bin parts with the entropy decoding based on a CM and bin parts without the entropy decoding based on the CM

extract corresponding bins from at least one of the bin parts with the entropy decoding based on the CM or the bin parts without the entropy decoding with the CM according to a corresponding table about CM for the bins of the plurality of the copying parameters in an entropy decoding process, to form the bins of the plurality of the copying parameters

convert the bins of the plurality of the copying parameters into the values of the plurality of the copying parameters

FIG. 3C

IMAGE ENCODING AND DECODING METHOD, IMAGE PROCESSING DEVICE AND COMPUTER STORAGE MEDIUM

TECHNICAL FIELD

The present disclosure relates to a digital video coding and decoding technology, and particularly to image coding and decoding methods, image processing equipment and a computer storage medium.

BACKGROUND

With development of a television and a display into resolutions of super-high definition (4K) and extra super-high definition (8K) and development and popularization of a new-generation cloud computing and information processing mode and platform adopting a remote desktop as a typical representation form, a video data compression requirement is also made for a higher-resolution composite image (or picture) including an image shot by a camera and a computer screen image. It becomes an indispensable technology of video coding for achieving an ultrahigh-compression ratio and extremely high-quality data compression.

Performing ultrahigh-efficiency compression on a video image by fully utilizing characteristics of a 4K/8K image and a computer screen image is also a main objective of a latest international video compression standard High Efficiency Video Coding (HEVC) as well as other international standards, national standards and industrial standards.

An outstanding characteristic of a computer screen image is that there may usually be many similar and even completely the same pixel patterns in the same image. For example, a Chinese or foreign character frequently appearing in a computer screen image is formed by a few basic strokes, and many similar or same strokes may be found in the same frame of image. A common menu, icon and the like in a computer screen image also have many similar or same patterns. Therefore, various copying manners are usually adopted in an existing image and video compression technology, at least including the following copying manners:

1) intra block copying, i.e. intra block matching or called as intra motion compensation or called as block matching or called as block copying;

2) intra micro-block copying, i.e. intra micro-block matching or called as micro-block matching or called as micro-block copying;

3) intra line (called as line for short) copying, i.e. intra line matching or called as line matching or called as line copying;

4) intra string copying, i.e. intra string matching or called as string matching or called as string copying or called as pixel string copying;

5) palette index string copying, i.e. palette or called as index string copying;

6) a mixed copying manner by mixing index string copying and pixel string copying, called as an index-pixel string mixed copying manner for short, also called as a palette-pixel string mixed copying manner or a palette manner mixing pixel string copying or a pixel string copying manner mixing palette or a palette and pixel string copying manner; and 7) a multiple palette and pixel string copying manner combining multiple palette and pixel string copying manners.

In a multi-pixel segment copying manner, for example, a micro-block copying manner, a line copying manner, a pixel string copying manner and a palette and pixel string copying manner, a coding/decoding block is partitioned into multiple pixel segments, each pixel segment has a copying parameter, and the copying parameter is formed by multiple types of copying parameters. In the multi-pixel segment copying manner, entropy coding or entropy decoding is sequentially performed on the copying parameters by taking a copying parameter as a unit according to a positional order of the corresponding pixel segments in the coding/decoding block. Since a copying parameter has both a binary code (called as bit or bin for short) part with entropy coding based on a Context Model (CM) and a bin part without entropy coding based on the CM, sequentially performing entropy coding on multiple copying parameters by taking a copying parameter as a unit may cause interleaved entropy coding on bin parts with the CM and bin parts without the CM of the copying parameters. Such an interleaving method seriously influences multi-bit parallel entropy coding and entropy decoding processing of the copying parameters and reduces an entropy coding and entropy decoding throughput.

SUMMARY

In order to solve the technical problem, embodiments of the disclosure provide image coding and decoding methods, image processing equipment and a computer storage medium.

An embodiment of the disclosure provides an image coding method, which may include the following actions.

Regulation processing is performed on multiple copying parameters of a current coding block.

Entropy coding is performed on the copying parameters according to an order of the copying parameters resulted from regulation processing, and a video bitstream including information of the multiple copying parameters is generated.

The multiple copying parameters may include one or more types of copying parameter components.

According to an embodiment, the coding block may be a coding region of an image, and the coding block may include at least one of: a Largest Coding Unit (LCU), a Coding Tree Unit (CTU), a Coding Unit (CU), a sub-region of the CU, a Prediction Unit (PU) or a Transform Unit (TU).

According to an embodiment, the action of performing regulation processing on the multiple copying parameters of the current coding block may include the following actions.

The copying parameters are divided into N subparts according to a predetermined rule, N≥2.

Same subparts of the copying parameters are classified, merged and re-sequenced, and then entropy coding is performed on the same subparts sequentially.

Each of the N subparts of the copying parameters may be null or non-null.

According to an embodiment, the action of perform regulation processing on the multiple copying parameters of the current coding block may further include the following actions.

The copying parameters are divided into bin parts with a CM and bin parts without the CM.

According to an embodiment, a copying manner used for the coding block may be a pixel string copying manner combined with a palette.

One or more types of following copying parameter components included in the copying parameters may be divided into the bin parts with the CM and the bin parts without the CM:

a type of a pixel segment, a copying position component 1 of the pixel segment, a copying position component 2 of the pixel segment, a copying position component 3 of the pixel segment and a copying length of the pixel segment.

According to an embodiment, the copying manner used for the coding block may be the pixel string copying manner combined with the palette.

When the copying parameters are divided into the bin parts with the CM and the bin parts without the CM, the bin parts with the CM may include the following one or more bins:

a type t of a pixel segment, where it may be indicated that a reference pixel is from the palette when t adopts a first value, and it may be indicated that the reference pixel is not from the palette when t adopts a second value;

an ABOVE copying position a of the pixel segment, where a may exist when t indicates that the reference pixel is not from the palette, it may be indicated that the reference pixel is at the ABOVE position when a adopts a third value, and it may be indicated that the reference pixel is not at the ABOVE position when a adopts a fourth value;

a displacement vector horizontal component x0 of the pixel segment, where x0 may exist when a indicates that the reference pixel is not at the ABOVE position, it may be indicated that the displacement vector horizontal component is zero when x0 adopts a fifth value, and it may be indicated that the displacement vector horizontal component is not zero when x0 adopts a sixth value;

a displacement vector vertical component y0 of the pixel segment, where y0 may exist when a indicates that the reference pixel is not at the ABOVE position, it may be indicated that the displacement vector vertical component is zero when y0 adopts a seventh value, and it may be indicated that the displacement vector vertical component is not zero when y0 adopts an eighth value; and a first bin $b_0$ in a binary representation of a copying length of the pixel segment.

According to an embodiment, the method may further include the following actions.

When the copying parameters are divided into the bin parts with the CM and the bin parts without the CM, the bin parts, with the CM of the copying parameters are classified into a group, and the bin parts without the CM of the copying parameters are classified into another group.

Entropy coding may be sequentially performed on the two groups during entropy coding.

According to an embodiment, the method may further include the following actions.

When the copying parameters are divided into the bin parts with the CM and the bin parts without the CM, entropy coding is performed on the copying parameter components of a same type in the bin parts with the CM in a centralized manner, and entropy coding is performed on the copying parameter components of a same type in the bin parts without the CM in the centralized manner.

According to an embodiment, the method may further include the following actions.

When the copying parameters are divided into the bin parts with the CM and the bin parts without the CM, entropy coding is performed on all bins of the copying parameters with the copying parameter components of a same type in the bin parts with the CM in the centralized manner, and entropy coding is performed on all bins of the copying parameters with the copying parameter components of a same type in the bin parts without the CM in the centralized manner.

An embodiment of the disclosure provides an image decoding method, which may include the following actions.

A video bitstream, including information of multiple copying parameters, of a decoding block is parsed.

Entropy decoding is performed on the multiple copying parameters to obtain bins of the multiple copying parameters.

A regulation operation is performed on the bins to obtain values of the multiple copying parameters.

The multiple copying parameters may include one or more types of copying parameter components.

According to an embodiment, the decoding block may be a decoding region of an image, and the decoding block may include at least one of: an LCU, a CTU, a CU, a sub-region of the CU, a PU and a TU.

According to an embodiment, the action of performing the regulation operation on the bins to obtain the values of the multiple copying parameters may include the following actions.

The bins are divided into N subparts according to a predetermined rule, N 2.

The bins in the subparts of the bins are classified, merged and mapped into reconstructed values of the multiple copying parameters.

Each of the N subparts of the copying parameters may be null or non-null.

According to an embodiment, the method may further include the following actions.

The bins are divided into bin parts with entropy decoding based on a CM and bin parts without entropy decoding based on the CM.

Corresponding bins are extracted from the bin parts with entropy decoding based on the CM and/or the bin parts without entropy decoding based on the CM according to a corresponding table about CM for the bins corresponding to the copying parameters in an entropy decoding process to form the bins corresponding to the copying parameters.

The bins corresponding to the copying parameters are converted into the values of the copying parameters.

According to an embodiment, a copying manner used for the decoding block may be a pixel string copying manner combined with a palette.

The bins corresponding to one or more types of following copying parameters may be divided into the bin parts with the CM and the bin parts without the CM, including:

a type of a pixel segment, a copying position component 1 of the pixel segment, a copying position component 2 of the pixel segment, a copying position component 3 of the pixel segment and a copying length of the pixel segment.

According to an embodiment, the copying manner used for the decoding block may be the pixel string copying manner combined with the palette.

When the bins corresponding to the copying parameters are divided into the bin parts with the CM and the bin parts without the CM, the bin parts with the CM may include the following one or more bins:

a type t of a pixel segment, where it may be indicated that a reference pixel is from the palette when t adopts a first value, and it may be indicated that the reference pixel is not from the palette when t adopts a second value;

an ABOVE copying position a of the pixel segment, where a may exist when t indicates that the reference pixel is not from the palette, it may be indicated that the reference pixel is at the ABOVE position when a adopts a third value, and it may be indicated that the reference pixel is not at the ABOVE position when a adopts a fourth value;

a displacement vector horizontal component x0 of the pixel segment, where x0 may exist when a indicates that the reference pixel is not at the ABOVE position, it may be indicated that the displacement vector horizontal component is zero when x0 adopts a fifth value, and it may be indicated that the displacement vector horizontal component is not zero when x0 adopts a sixth value;

a displacement vector vertical component y0 of the pixel segment, where y0 may exist when a indicates that the reference pixel is not at the ABOVE position, it may be indicated that the displacement vector vertical component is zero when y0 adopts a seventh value, and it may be indicated that the displacement vector vertical component is not zero when y0 adopts an eighth value; and a first bin $b_0$ in a binary representation of a copying length of the pixel segment.

According to an embodiment, the method may further include the following actions.

When the bins corresponding to the copying parameters are divided into the bin parts with the CM and the bin parts without the CM, entropy decoding is sequentially performed on the video bitstream corresponding to the bins, with the CM, of the copying parameters, and entropy decoding is performed on the video bitstream corresponding to the bin parts, without the CM, of the copying parameters.

The corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters.

The bins corresponding to the copying parameters are converted into the values of the copying parameters.

According to an embodiment, the method may further include the following actions.

During entropy decoding, entropy decoding is sequentially performed on a group formed by the bin parts with the CM in the bins corresponding to the copying parameters and another group formed by the bin parts without the CM in the bins corresponding to the copying parameters.

When the bins corresponding to the copying parameters are divided into the bin parts with the CM and the bin parts without the CM, entropy decoding is performed on the bitstream corresponding to the bins of the copying parameter components of a same type in the bin parts with the CM, and entropy decoding is correspondingly performed on the bins of the copying parameter components of a same type in the bin parts without the CM.

The corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters.

The bins corresponding to the copying parameters are converted into the values of the copying parameters.

According to an embodiment, the method may further include the following actions.

When the bins corresponding to the copying parameters are divided into the bin parts with the CM and the bin parts without the CM, entropy decoding is performed on the video bitstream corresponding to the bins of the copying parameters with the copying parameter components of the same types in the bin parts with the CM, and entropy decoding is performed on the video bitstream corresponding to the bins of the copying parameters with the copying parameter components of the same types in the bin parts without the CM.

The corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters.

the bins corresponding to the copying parameters are converted into the values of the copying parameters.

An embodiment of the disclosure provides image processing equipment, which may include a reorganization unit and an entropy coding unit.

The reorganization unit is configured to perform regulation processing on multiple copying parameters of a current coding block.

The entropy coding unit is configured to perform entropy coding on the copying parameters according to an order of the copying parameters resulted from the regulation processing, and generate a video bitstream including information of the multiple copying parameters.

The multiple copying parameters may include one or more types of copying parameter components.

Another embodiment of the disclosure provides image processing equipment, which may include a parsing unit and an entropy decoding unit.

The parsing unit is configured to parse a video bitstream, including information of multiple copying parameters, of a decoding block.

The entropy decoding unit is configured to perform entropy decoding on the multiple copying parameters to obtain bins of the multiple copying parameters, and perform a regulation operation on the bins to obtain values of the multiple copying parameters.

The multiple copying parameters may include one or more types of copying parameter components.

An embodiment of the disclosure provides a computer storage medium, which may store a computer program, the computer program being configured to execute the above-mentioned image coding and/or image decoding method(s).

In the technical solutions of the embodiments of the disclosure, image coding includes the following actions. Regulation processing is performed on the multiple copying parameters of the current coding block. Entropy coding is performed on the copying parameters according to an order of the copying parameters resulted from regulation processing, and the video bitstream including the information of the multiple copying parameters is generated, where the multiple copying parameters include the one or more types of copying parameter components. Image decoding includes the following actions. The video bitstream, including the multiple copying parameters, of the decoding block is parsed. Entropy decoding is performed on the multiple copying parameters to obtain the bins of the multiple copying parameters. The regulation operation is performed on the bins to obtain the values of the multiple copying parameters, where the multiple copying parameters include the one or more types of copying parameter components. Thus it can be seen that the embodiments of the disclosure avoid influence of an interleaving method on multi-bit parallel entropy coding and entropy decoding processing of the copying parameters and improve an entropy coding and entropy decoding throughput.

BRIEF DESCRIPTION OF DRAWINGS

In the drawings (which may not be drawn to scale), similar drawing reference signs may describe similar parts in different drawings. Similar drawing reference signs with different letter suffixes may represent different examples of similar parts. The drawings substantially show each embodiment discussed in the disclosure not limitedly but exemplarily.

FIG. 1 is an example diagram of performing entropy coding on multiple copying parameters according to an order of the copying parameters resulted from division, classification and reorganization and placing them in a bitstream according to an embodiment of the disclosure.

FIGS. 2A-2C are a first flowchart of an image coding method according to an embodiment of the disclosure.

FIGS. 3A-3C are a first flowchart of an image decoding method according to an embodiment of the disclosure.

DETAILED DESCRIPTION

Figure 2A:
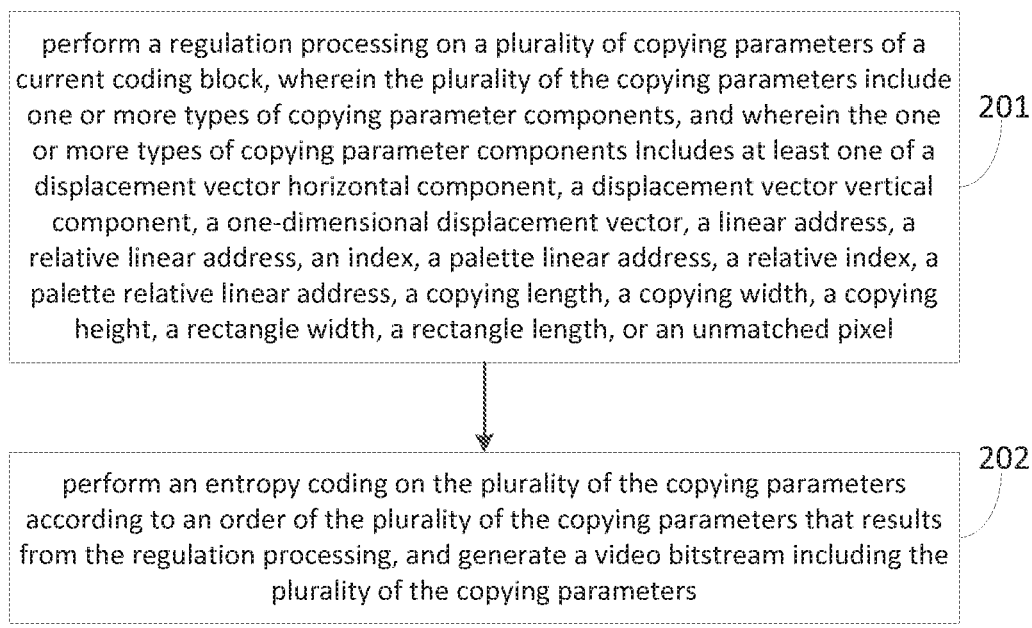

In order to make characteristics and technical contents of the embodiments of the disclosure understood in more detail, implementation of the embodiments of the disclosure will be elaborated below in combination with the drawings. The appended drawings are only adopted for description as references and not intended to limit the embodiments of the disclosure.

A natural form of a digital video signal is a sequence of images (or pictures). An image is usually a rectangular region formed by multiple pixels, and a digital video signal is a video image sequence, which is also called as a video sequence or a sequence sometimes for short, formed by dozens of and even hundreds of thousands of images. Coding a digital video signal refers to coding images in the video sequence. At any time, the image which is being coded is called as a current coding image (or current encoding image). Similarly, decoding a video bitstream (called as a bitstream for short) obtained by compressing the digital video signal refers to decode a bitstream of a sequence of images. At any time, the image which is being decoded is called as a current decoding image. The current coding image or the current decoding image is collectively called as a current image.

In almost all international standards for video coding such as Moving Picture Experts Group (MPEG)-1/2/4, H.264/Advanced Video Coding (AVC) and HEVC, when an image is coded (and correspondingly decoded), the image is partitioned into multiple blocks of sub-images with M×M pixels, called as coding blocks (which are decoded blocks from the point of decoding, collectively called as coding and decoded blocks) or "CUs", and sub-images are coded block by block by taking a CU as a basic coding unit. M is usually 4, 8, 16, 32 and 64. Therefore, coding a video sequence refers to sequentially coding CUs of an image. At any time, a CU which is being coded is called as a current coding CU (or current encoding CU). Similarly, decoding a bitstream of a video sequence refers to sequentially decoding CUs of an image to finally reconstruct the whole video sequence. At any time, a CU which is being decoded is called as a current decoding CU. The current coding CU or the current decoding CU is collectively called as a current CU.

In order to achieve adaptability to differences of image contents and properties of a part in an image for effective compression, sizes of CU in the image may be different, some being 8×8, some being 64×64 and the like. In order to seamlessly splice CUs with different sizes, an image is usually partitioned into "LCUs" of the same size containing N×N pixels at first, and then LCU can be further partitioned into multiple tree-structured CUs of maybe different sizes. LCU is also called as "CTU". For example, an image is partitioned into LCUs with the same size of 64×64 pixels (N=64) at first, wherein a certain LCU is further partitioned into three CUs of 32×32 pixels and four CUs of 16×16 pixels, and in such a manner, seven tree-structured CUs form a CTU. Another LCU can be partitioned into two CUs of 32×32 pixels, three CUs of 16×16 pixels and twenty CUs of 8×8 pixels, totally the 25 tree-structured CUs. Coding an image is to sequentially code CUs in LCUs. In the international standard HEVC, LCU and CTU are synonyms. A CU of a size equal to a CTU is called as a CU with a depth 0. CUs obtained by equally partitioning upper, lower, left and right parts of the CU with the depth 0 are called as CUs with depths 1. CUs obtained by equally partitioning upper, lower, left and right parts of a CU with the depth 1 are called as CUs with depths 2. CUs obtained by equally partitioning upper, lower, left and right parts of a CU with the depth 2 are called as CUs with depths 3. At any time, a CTU which is being coded is called as a current coding CTU. At any time, a CTU which is being decoded is called as a current decoding CTU. The current coding CTU or the current decoding CTU is collectively called as a current CTU.

A CU may further be partitioned into a plurality of sub-regions. The sub-regions include, but not limited to, a PU, a TU and an Asymmetric Multi-Processing (AMP) region.

A color pixel usually consists of three components. Two most common pixel color formats include a Green, Blue and Red (GBR) color format, which consists of a green component, a blue component and a red component; and YUV color format, which consists of a luma component and two chroma components. Color formats collectively called as YUV actually include multiple color formats, such as a YCbCr color format. When a CU is coded, the CU may be partitioned into three component planes (a G plane, a B plane and an R plane or a Y plane, a U plane and a V plane), which are coded respectively; and three components of a pixel may also be bundled and combined into a triple, and the whole CU formed by these triples is coded. The former pixel and component arrangement manner is called as a planar format of an image (and its CUs), and the latter pixel and component arrangement manner is called as a packed format of the image (and its CUs). A GBR color format and YUV color format of a pixel are both three-component representation formats of the pixel.

Besides a three-component representation format of a pixel, another common representation format of the pixel in a conventional art is a palette index representation format. In the palette index representation format, a numerical value of a pixel may also be represented by an index of a palette. Palette (or palette space) stores numerical values or approximate numerical values of three components of a color of the pixel to be represented. An address of the palette is called as an index of the color of the pixel stored in the address. An index may represent a component of a color of a pixel, and an index may also represent three components of a color of a pixel. There may be one or more palettes. Under the condition that there are multiple palettes, a complete index is actually formed by two parts, i.e. a palette number (representing the specific one in the multiple palettes) and an index of the palette with the palette number. An index representation format of a pixel is to represent the pixel with an index. If not all pixels in an image region (for example, a coding block or a decoding block) may be represented with palette colors (that is, for at least one pixel in the image region, there is no palette color of which three components have numerical values equal to or approximately equal to the pixel and an index thereof), there is usually a special index, called as an escape color and configured to represent the pixel which may not be represented with a color of a normal palette. Therefore, if an index of a pixel indicates an index of an escape color, three other dedicated components are required to represent a color of the pixel. A normal color and escape color in a palette are both called as palette colors, but the escape color is a virtual color, and there is no physical space for storing this color but a special dedicated virtual index in the palette. An index of an escape color is usually set as the last index of a palette. The index representation format of the pixel is also called as an indexed color or pseudo color representation format of the pixel, or is usually directly called as an indexed pixel or a pseudo pixel or a pixel index or an index. An index is also called as an exponent sometimes. Representing a pixel in an index representation format is also called as indexing or exponentiating.

Other common pixel representation formats include a CMYK representation format and a grayscale representation format.

A YUV color format may also be subdivided into a plurality of sub-formats according to whether to perform down-sampling on a chroma component or not: a YUV4:4:4 pixel color format in which a pixel is formed by a Y component, a U component and a V component; a YUV4:2:2 pixel color format in which two left and right adjacent pixels are formed by two Y components, a U component and a V component; and a YUV4:2:0 pixel color format in which four left, right, upper and lower adjacent pixels arranged according to 2×2 spatial positions are formed by four Y components, a U component and a V component. A component is usually represented by a number with 8-16 bits. The YUV4:2:2 pixel color format and the YUV4:2:0 pixel color format are both obtained by executing chroma component down-sampling on the YUV4:4:4 pixel color format. A pixel component is also called as a pixel sample, or is simply called as a sample.

A most basic element during coding or decoding may be a pixel, may also be a pixel component, and may further be a pixel index (i.e. indexed pixel). A pixel or pixel component or indexed pixel adopted as the most basic element for coding or decoding is collectively called as a pixel sample, and is also collectively called as a pixel value sometimes or simply called as a sample.

In the embodiments of the disclosure, "pixel sample", "pixel value", "sample", "indexed pixel" and "pixel index" are synonyms, and according to the context, it is clear that whether a "pixel" is represented or "a pixel component" is represented or an "indexed pixel" is represented or any one of the three is simultaneously represented. If it cannot get clear from the context, any one of the three is simultaneously represented.

In the embodiments of the disclosure, a coding block or a decoding block (collectively called as a coding and decoding block) is a region formed by multiple pixels. A shape of the coding and decoding block may be a rectangle, a square, a parallelogram, a trapezoid, a polygon, a round, an ellipse, a string and any other shape. The rectangle also includes a rectangle of which a width or height is one pixel and which is degenerated into a line (i.e. a line segment or a line shape). In an image, coding blocks (or decoding blocks) may have different shapes and sizes. In an image, some or all of coding blocks (or decoding blocks) may have mutually overlapped parts, and all of the coding blocks (or decoding blocks) may also not be overlapped. A coding blocks (or decoding blocks) may be formed by "pixels", may also be formed by "components of the pixels", may also be formed by "indexed pixels", may also be formed by mixing the three, and may further be formed by mixing any two of the three. From the point of video coding or decoding, a coding block (or a decoding block) refers to a region which is coded (or decoded) in an image, including, but not limited to, at least one of: an LCU, a CTU, a CU, a sub-region of the CU, a PU and a TU.

An outstanding characteristic of a computer screen image is that there may usually be many similar and even completely same pixel patterns in the same image. For example, a Chinese or foreign character frequently appearing in a computer screen image is formed by a few basic strokes, and many similar or the same strokes may be found in the same image. A common menu, icon and the like in a computer screen image also have many similar or the same patterns. Therefore, a copying manner adopted by an image and video compression technology at least includes the following copying manners.

1) Intra block copying, i.e. intra block matching or called as intra motion compensation or called as block matching or called as block copying: a basic operation of block copying coding or decoding is to copy a reference block with the same size (the same number of pixel samples) as a current block from a reconstructed reference pixel sample set for the current coding block or current decoded block (called as the current block) and assign a numerical value of the reference block to the current block. A copying parameter of the block copying manner includes a displacement vector of the current block, which indicates a relative position between the reference block and the current block. A current block has a displacement vector.

2) Intra micro-block copying, i.e. intra micro-block matching or called as micro-block matching or called as micro-block copying: during micro-block copying, a current block (for example, 8×8 pixel samples) is partitioned into multiple micro-blocks (such as micro-blocks with 4×2 pixel samples or micro-blocks with 8×2 pixel samples or micro-blocks with 2×4 pixel samples or micro-blocks with 2×8 pixel samples), and a basic operation of micro-block copying coding or decoding is to copy a reference micro-block from a reconstructed reference pixel sample set for each coding micro-block or decoding micro-block (called as a current micro-block) in the current block and assign a numerical value of the reference micro-block to the current micro-block. A copying parameter of the micro-block copying manner includes a displacement vector of the current micro-block, which indicates a relative position between the reference micro-block and the current micro-block. A current micro-block has a displacement vector. A number of micro-blocks into which a current block is partitioned is equal to a number of displacement vectors.

3) Intra line (called as line (or strip) for short) copying, i.e. intra line matching or called as line matching or called as line copying: a line is a micro-block with a height 1 or a width 1, such as a micro-block with 4×1 or 8×1 or 1×4 or 1×8 pixel samples. A basic operation of line copying coding or decoding is to copy a reference line from a reconstructed reference pixel sample set for a coding line or decoding line (called as a current line for short) in a current block and assign a numerical value of the reference line. Obviously, line copying is a special condition of micro-block copying. A copying parameter of the line copying manner includes a displacement vector of the current line, which indicates a relative position between the reference line and the current line. A current line has a displacement vector. A number of lines into which a current block is partitioned is equal to a number of displacement vectors.

4) Intra string copying, i.e. intra string matching or called as string matching or called as string copying or called as pixel string copying: during pixel string copying, a current coding block or current decoding block (called as a current block) is partitioned into multiple pixel sample strings with variable lengths. Here, a string refers to arranging pixel samples in a two-dimensional region in any shape into a string of which a length is far larger than a width (such as a string of which a width is a pixel sample while a length is 37 pixel samples or a string of which a width is two pixel samples while a length is 111 pixel samples, usually under, but not limited to, the condition that the length is an independent coding or decoding parameter while the width is a parameter which is predetermined or derived from another coding or decoding parameter). A basic operation of string copying coding or decoding is to copy a reference string from a reconstructed reference pixel sample set for a coding string or decoding string (called as a current string for short) in the current block and assign a numerical value of the reference string. A copying parameter of the string copying manner includes a displacement vector and copying length, i.e. copying size, of the current string, which indicate a relative position between the reference string and the current string and a length of the current string, i.e. a number of pixel samples, respectively. The length of the current string is also a length of the reference string. A current string has a displacement vector and a copying length. A number of strings into which a current block is partitioned is equal to a number of displacement vectors and a number of copying lengths. The displacement vector is also called as a copying position, and its representation form includes: a two-dimensional coordinate, a linear address, a distance, a pointer, an index, a number, a mode number and the like.

5) Palette index string copying, i.e. palette or called as index string copying: in palette coding and corresponding decoding manners, a palette is constructed or acquired at first, then part or all of pixels of a current coding block or current decoding block (called as a current block for short) are represented with an index of a palette color in the palette, and the index is coded and decoded, including, but not limited to: partitioning a current block into multiple variable-length index strings for index string copying coding and decoding. A basic operation of index string copying coding and decoding is to copy a reference index string from an indexed reconstructed reference pixel sample set for an index coding string or index decoding string (called as a current index string for short) in the current block and assign an index numerical value of the reference index string to a current index string. A copying parameter of the index string copying manner includes a displacement vector and copying length, i.e. copying size, of the current index string, which indicate a relative position between the reference index string and the current index string and a length, i.e. a number of corresponding pixel samples, of the current index string respectively. The length of the current index string is also a length of the reference index string. A current index string has a displacement vector and a copying length. A number of index strings into which a current block is partitioned is equal to a number of displacement vectors and a number of copying lengths. The displacement vector is also called as a copying position, and its representation form includes one or more of the followings: a two-dimensional coordinate, a linear address, a distance, a pointer, an index, a number, a mode number and the like. In the palette index string copying manner, a copied reference pixel is extracted from the palette. Therefore, an index string is also called as a palette color string or a palette pixel string or a palette string, and the index string copying manner is also called as a palette copying manner or a palette manner. In the palette manner, a string is also called as a run or a run length. Therefore, an index string is also called as an index run or an index run length or called as a run or a run length for short. A palette color of a current block is sourced from a pixel color of the current block and/or a palette color candidate set, and the palette color candidate set is formed by accumulating part of palette colors of coding and decoding blocks which have been coded and decoded.

6) A mixed copying manner mixing index string copying and pixel string copying, called as an index-pixel string mixed copying manner for short, also called as a palette-pixel string mixed copying manner or a palette manner mixing pixel string copying or a pixel string copying manner combined with a palette or a palette and pixel string copying manner: when a current coding block or current decoding block (called as a current block for short) is coded or decoded, a pixel string copying manner is adopted for part or all of pixels, and an index copying manner, i.e. a palette manner extracting a reference pixel from a palette, is adopted for part or all of the pixels.

7) A multiple palette and pixel string copying manner combining multiple palette and pixel string copying manners: at least two different palette and pixel string copying manners are adopted for coding and decoding. Different palette and pixel string copying manners adopt different mixing solutions to mix palette copying and pixel string copying. In an image, a palette and pixel string copying manner of a mixing solution I is adopted for part of coding/decoding blocks, a palette and pixel string copying manner of a mixing solution II is adopted for part of coding/decoding blocks, a palette and pixel string copying manner of a mixing solution III is adopted for part of coding/decoding blocks, and the like. Different mixing solutions may be different mainly in the following aspects: 1) a number of sorts of strings, 2) a value range of a parameter, 3) (a) value range(s) of one or a plurality of copying parameters, 4) a value range of a copying position, i.e. a displacement vector, 5) a position of a current index or a current pixel, 6) a position of a current sample segment, 7) a position of a reference index or a reference pixel, 8) a position of a reference sample segment, and 9) a copying shape.

Other copying manners further include a rectangular copying manner, a copying manner mixing a plurality of copying manners and the like.

A block in the block copying manner, a micro-block in the micro-block copying manner, a line in the line copying manner, a string in the string copying manner, a rectangle in the rectangular copying manner and a pixel index string in the palette index manner are collectively called as pixel sample segments, also called as sample segments for short. A basic element of a sample segment is a pixel or a pixel component or a pixel index. A sample segment has a copying parameter, configured to represent a relationship between a current pixel sample segment and a reference pixel sample segment. Therefore, a sample segment is a minimum unit of a copying operation with the same copying relationship. A copying parameter includes a plurality of copying parameter components, the copying parameter components at least including: a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length and an unmatched pixel (also called as a reference-free pixel, i.e. a non-copying pixel which is not copied from another place).

In each copying manner, pixel samples or indexes are required to be arranged according to a certain sequence. An arrangement manner is also called as a scanning manner. The scanning manner may be partitioned into the following manners according to a path shape.

A) A horizontal Z-shaped scanning manner, also called as a horizontal raster scanning manner: pixel samples or indexes of a coding block or decoding block (collectively called as a coding/decoding block) are arranged in rows, and are arranged in all the rows according to the same direction (all from left to right or all from right to left). The rows may be arranged from top to bottom, and may also be arranged from bottom to top.

B) A vertical Z-shaped scanning manner, also called as a vertical raster scanning manner: pixel samples or indexes of a coding block or decoding block (collectively called as a coding/decoding block) are arranged in columns, and are arranged in all the columns according to the same direction (all from top to bottom or all from bottom to top). The columns may be arranged from left to right, and may also be arranged from right to left.

C) A horizontal arched scanning manner: pixel samples or indexes of a coding block or decoding block (collectively called as a coding/decoding block) are arranged in rows, are arranged in the odd rows according to a direction (for example: from left to right), and are arranged in the even rows according to another (opposite) direction (for example: from right to left). The rows may be arranged from top to bottom, and may also be arranged from bottom to top.

D) A vertical arched scanning manner: pixel samples or indexes of a coding block or decoding block (collectively called as a coding/decoding block) are arranged in columns, are arranged in the odd columns according to a direction (for example: from top to bottom), and are arranged in the even columns according to another (opposite) direction (for example: from bottom to top). The columns may be arranged from left to right, and may also be arranged from right to left.

In a string copying (index string copying or pixel string copying or index spring-pixel string mixed copying) manner, there are the following two basic copying manners.

I) A one-dimensional linear copying shape: each of a current string and a reference string is a one-dimensional sample string formed in a coding/decoding block according to a sequence of a predetermined scanning manner, and has an equal length, but two-dimensional regions formed by the two strings respectively may not have the same two-dimensional shape.

II) a two-dimensional conformal copying shape: a current string is arranged in a current coding/decoding block according to a sequence of a predetermined scanning manner, and a reference string and the current string keep completely the same two-dimensional shape, and have an equal length.

Each above basic copying shape may further be partitioned into multiple copying shapes according to a specific scanning manner, for example, a vertical arched one-dimensional linear copying shape and a horizontal Z-shaped two-dimensional conformal copying shape.

It is important to note that "copying" is a reconstruction and decoding operation, and a corresponding decoding operation is "matching". Therefore, each copying manner, for example, a block matching manner, a micro-block copying manner, a line copying manner, a pixel string copying manner and an index string copying manner, is also called as a block matching manner, a micro-block matching manner, a line matching manner, a pixel string matching manner, an index string matching manner and the like.

In a multi-pixel segment copying manner, for example, a micro-block copying manner, a line copying manner, a pixel string copying manner and a palette and pixel string copying manner, a coding/decoding block is partitioned into multiple pixel segments, a pixel segment has a copying parameter, and the copying parameter is formed by multiple types of copying parameters. In the multi-pixel segment copying manner, entropy coding or entropy decoding is sequentially performed on the copying parameters by taking a copying parameter as a unit according to a positional order of the corresponding pixel segments in the coding/decoding block. Since a copying parameter may have both a binary code (called as bit or bin for short) part with entropy coding based on a CM and a bin part without entropy coding based on the CM, sequentially performing entropy coding on multiple copying parameters by taking a copying parameter as a unit may cause interleaved entropy coding on bin parts with the CM and bin parts without the CM of the copying parameters. Such an interleaving method seriously influences multi-bit parallel entropy coding and entropy decoding processing of the copying parameters and reduces an entropy coding and entropy decoding throughput.

On such a basis, the embodiments of the disclosure provide image coding and decoding methods and image processing equipment. When one or more types of copying parameters of a coding/decoding block are coded/decoded, a copying parameter is divided into a plurality of parts according to a predetermined rule at first, and the same parts of copying parameters are classified, merged and re-sequenced, and then entropy decoding is performed on the same parts sequentially.

In the embodiments of the disclosure, each copying parameter is divided into a bin part using a CM and a bin part without the CM.

In the embodiments of the disclosure, the bin parts, with the CM, of a copying parameter are classified into a group, the bin parts, without the CM, of a copying parameter are classified into another group, entropy coding or entropy decoding is performed on one group at first, and then entropy coding or entropy decoding is performed on the other group, as shown in FIG. 1(a).

In the embodiments of the disclosure, in the classified and merged bin parts, with the CM, of the copying parameters, entropy coding or entropy decoding is performed on the same types of copying parameters in a centralized manner, and in the classified and merged bin parts, without the CM, of the copying parameters, entropy coding or entropy decoding is performed on the same types of copying parameters in the centralized manner. As shown in FIG. 1(b), entropy coding or entropy decoding is performed on the bin parts, with the CM, of the first type of copying parameters, i.e. copying parameters A, (for example: displacement vector horizontal components) in the centralized manner for writing or parsing the video bitstream, entropy coding or entropy decoding is performed on the bin parts, with the CM, of the second type of copying parameters, i.e. copying parameters B, (for example: displacement vector vertical components) in the centralized manner for writing or parsing the video bitstream, entropy coding or entropy decoding is performed on the bin parts, with the CM, of the third type copying parameters, i.e. copying parameters C, (for example: copying lengths) in the centralized manner for existence in the video bitstream, and the like. Then, entropy coding or entropy decoding is performed on the bin parts, without the CM, of the first type of copying parameters, i.e. the copying parameters A, (for example: the displacement vector horizontal components) in the centralized manner for writing or parsing the video bitstream, entropy coding or entropy decoding is performed on the bin parts, without the CM, of the second type of copying parameters, i.e. the copying parameters B, (for example: the displacement vector vertical components) in the centralized manner for writing or parsing the video bitstream, entropy coding or entropy decoding is performed on the bin parts, without the CM, of the third type of copying parameters, i.e. the copying parameters C, (for example: the copying lengths) in the centralized manner for writing or parsing the video bitstream, and the like.

In the embodiments of the disclosure, in the classified and merged bin parts, with the CM, of the copying parameters, entropy coding or entropy decoding is performed on all bits of a copying parameter of the same types of copying parameters in the centralized manner for writing or parsing the video bitstream; and in the classified and merged bin parts, without the CM, of the copying parameters, entropy coding or entropy decoding is performed on all bits of a copying parameter of the same types of copying parameters in the centralized manner for writing or parsing the video bitstream. As shown in FIG. 1(c), in the classified and merged bin parts, with the CM, of the copying parameters, entropy coding or entropy decoding is performed on all bits $A_{11}, A_{12}, \ldots A_{1i}$ (there are totally i bits, and here, $A_{pq}$ represents a qth bit of a pth copying parameter of the copying parameters A) of a first copying parameter of the first type of copying parameters, i.e. the copying parameters A, in the centralized manner for writing or parsing the video bitstream, then entropy coding or entropy decoding is performed on all bits $A_{21}, A_{22}, \ldots A_{2i}$ of a second copying parameter of the copying parameters A in the centralized manner for existence in the video bitstream, . . . , entropy coding or entropy decoding is performed on all bits $A_{k1}, A_{k2}, \ldots A_{ki}$ of a kth copying parameter of the copying parameters A in the centralized manner for existence in the video bitstream till all bits of a last copying parameter of the copying parameters A, then entropy coding or entropy decoding is performed on all bits $B_{11}, B_{12}, \ldots B_{1m}$ (there are totally m bits, and here, $B_{pq}$ represents a qth bit of a pth copying parameter of the copying parameters B) of a first copying parameter of the second type of copying parameters, i.e. the copying parameters B, in the centralized manner for writing or parsing the video bitstream, then entropy coding or entropy decoding is performed on all bits $B_{21}, B_{22}, \ldots B_{2m}$ of a second copying parameter of the copying parameters B in the centralized manner for writing or parsing the video bitstream, . . . , entropy coding or entropy decoding is performed on all bits $B_{k1}, B_{k2}, \ldots B_{km}$ of a kth copying parameter of the copying parameters B in the centralized manner for writing or parsing the video bitstream till all bits of a last copying parameter of the copying parameters B, and the like; and in the classified and merged bin parts, without the CM, of the copying parameters, entropy coding or entropy decoding is performed on all bits $A_{1(i+1)}, A_{1(i+2)}, \ldots A_{1j}$ (there are totally j-i bits, and here, $A_{pq}$ represents the qth bit of the pth copying parameter of the copying parameters A) of the first copying parameter of the first type of copying parameters, i.e. the copying parameters A, in the centralized manner for writing or parsing the video bitstream, then entropy coding or entropy decoding is performed on all bits $A_{2(i+1)}, A_{2(i+2)}, \ldots A_{2j}$ of the second copying parameter of the copying parameters A in the centralized manner for writing or parsing the video bitstream, . . . , entropy coding or entropy decoding is performed on all bits $A_{k(i+1)}, A_{k(i+2)}, \ldots A_{kj}$ of the kth copying parameter of the copying parameters A in the centralized manner for writing or parsing the video bitstream till all bits of the last copying parameter of the copying parameters A, then entropy coding or entropy decoding is performed on all bits $B_{1(m+1)}, B_{1(m+2)}, \ldots B_{1n}$ (there are totally n-m bits, and here, $B_{pq}$ represents the qth bit of the pth copying parameter of the copying parameters B) of the first copying parameter of the second type of copying parameters, i.e. the copying parameters B, in the centralized manner for writing or parsing the video bitstream, then entropy coding or entropy decoding is performed on all bits $B_{2(m+1)}, B_{2(m+2)}, \ldots B_{2n}$ of the second copying parameter of the copying parameters B in the centralized manner for writing or parsing the video bitstream, . . . , entropy coding or entropy decoding is performed on all bits $B_{k(m+1)}, B_{k(m+2)}, \ldots B_{kn}$ of the kth copying parameter of the copying parameters B in the centralized manner for writing or parsing the video bitstream till all bits of the last copying parameter of the copying parameters B, and the like.

In the embodiments of the disclosure, in the classified and merged bin parts, with the CM, of the copying parameters, entropy coding or entropy decoding is performed on a bit of each of all the copying parameters of the same types of copying parameters in the centralized manner for existence in the video bitstream, and in the classified and merged bin parts, without the CM, of the copying parameters, entropy coding or entropy decoding is performed on a bit of each of all the copying parameters of the same types of copying parameters in the centralized manner for writing or parsing the video bitstream. As shown in FIG. 1(d), in the classified and merged bin parts, with the CM, of the copying parameters, entropy coding or entropy decoding is performed on the first bits $A_{11}, A_{21}, \ldots A_{k1}, \ldots$ (here, $A_{pq}$ represents the qth bit of the pth copying parameter of the copying parameters A) of all the copying parameters of the first type of copying parameters, i.e. the copying parameters A, in the centralized manner for writing or parsing the video bitstream, then entropy coding or entropy decoding is performed on the second bits $A_{12}, A_{22}, \ldots A_{k2}, \ldots$ of all the copying parameters of the copying parameters A in the centralized manner writing or parsing the video bitstream until entropy coding or entropy decoding is performed on the last bits, i.e. the ith bits $A_{1i}, A_{2i}, \ldots A_{ki}, \ldots$, of all the copying parameters of the copying parameters A in the centralized manner for writing or parsing the video bitstream, then entropy coding or entropy decoding is performed on the first bits $B_{11}, B_{21}, \ldots B_{k1}, \ldots$ (here, $B_{pq}$ represents the qth bit of the pth copying parameter of the copying parameters B) of all the copying parameters of the second type of copying parameters, i.e. the copying parameters B, in the centralized manner for writing or parsing the video bitstream, then entropy coding or entropy decoding is performed on the second bits $B_{12}, B_{22}, \ldots B_{k2}, \ldots$ of all the copying parameters of the copying parameters B in the centralized manner for writing or parsing the video bitstream until entropy coding or entropy decoding is performed on the last bits, i.e. the mth bits $B_{1m}, B_{2m}, \ldots B_{km}, \ldots$, of all the copying parameters of the copying parameters B in the centralized manner for writing or parsing the video bitstream, and the like; and in the classified and merged bin parts, without the CM, of the copying parameters, entropy coding or entropy decoding is performed on the (i+1)th bits $A_{1(i+1)}, A_{2(i+1)}, \ldots A_{k(i+1)}, \ldots$ (here, $A_{pq}$ represents the qth bit of the pth copying parameter of the copying parameters A) of all the copying parameters of the first type of copying parameters, i.e. the copying parameters A, in the centralized manner for writing or parsing the video bitstream, then entropy coding or entropy decoding is performed on the (i+2)th bits $A_{1(i+2)}, A_{2(i+2)}, \ldots A_{k(i+2)}, \ldots$ of all the copying parameters of the copying parameters A in the centralized manner for writing or parsing the video bitstream until entropy coding or entropy decoding is performed on the last bits, i.e. the jth bits $A_{1j}, A_{2j}, \ldots A_{kj}, \ldots$, of all the copying parameters of the copying parameters A in the centralized manner for writing or parsing the video bitstream, then entropy coding or entropy decoding is performed on the (m+1)th bits $B_{1(m+1)}, B_{2(m+1)}, \ldots B_{k(m+1)}, \ldots$ (here, $B_{pq}$ represents the qth bit of the pth copying parameter of the copying parameters B) of all the copying parameters of the second type of copying parameters, i.e. the copying parameters B, in the centralized manner for writing or parsing the video bitstream, then entropy coding or entropy decoding is performed on the (m+2)th bits $B_{1(m+2)}, B_{2(m+2)}, \ldots B_{k(m+2)}, \ldots$ of all the copying parameters of the copying parameters B in the centralized manner for writing or parsing the video bitstream until entropy coding or entropy decoding is performed on the last bits, i.e. the nth bits $B_{1n}, B_{2n}, \ldots B_{kn}, \ldots$, of all the copying parameters of the copying parameters B in the centralized manner for writing or parsing the video bitstream, and the like.

According to the technical solutions of the embodiments of the disclosure, entropy coding or entropy decoding is not sequentially performed on the copying parameters by taking a copying parameter as a unit according to a positional order of corresponding pixel segments in a coding/decoding block for writing or parsing the video bitstream, and instead, a copying parameter of one or more copying parameters is divided into a plurality of parts (individual parts of individual copying parameters may also be null), the same parts of each copying parameter are classified, merged and re-sequenced, and then entropy coding or entropy decoding is sequentially performed for writing or parsing the video bitstream.

According to the technical solutions of the embodiments of the disclosure, one or more copying parameters are divided, classified and reorganized, including division of individuals of the copying parameters, divided individual parts are classified and reorganized into a new arrangement sequence, and entropy coding or entropy decoding is sequentially performed according to the new arrangement sequence for writing or parsing the video bitstream. The embodiments of the disclosure are applied to coding and decoding of a packed format image, and the embodiments of the disclosure are also applied to coding and decoding of a component planar format image.

FIGS. 2A-2C are a first flowchart of an image coding method according to an embodiment of the disclosure. In the embodiment of the disclosure, entropy coding is performed on multiple copying parameters of one or more types of copying parameters of a current coding block according to an order of the copying parameters resulted from division, classification and reorganization, and a video bitstream at least including information of the multiple copying parameters is generated. As shown in FIG. 2A, the image coding method includes the following steps.

In Step 201, regulation processing is performed on multiple copying parameters of a current coding block, where the multiple copying parameters include one or more types of copying parameter components.

In Step 202, entropy coding is performed on the copying parameters according to an order of the copying parameters resulted from regulation processing, and a video bitstream including information of the multiple copying parameters is generated.

Figure 9:
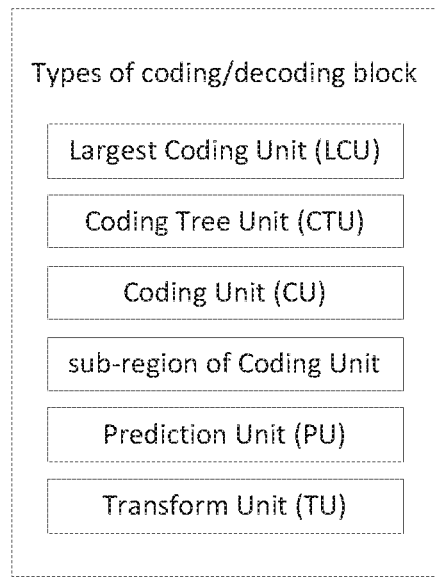
FIG. 9 is a diagram illustrating types of coding/decoding block according to an embodiment of the disclosure.

In the solution of the embodiment of the disclosure, the coding block is a coding region of an image, and the coding block includes at least one of: an LCU, a CTU, a CU, a sub-region of the CU, a PU and a TU, as shown in FIG. 9.

In the solution of the embodiment of the disclosure, as shown in FIG. 2B, the operation that regulation processing is performed on the multiple copying parameters of the current coding block includes that:

the copying parameters are divided into N subparts according to a predetermined rule, N≥2; and the same subparts of the copying parameters are classified, merged and re-sequenced, and entropy coding is performed on the same subparts sequentially, where each of the N subparts of the copying parameters are null or non-null.

In the solution of the embodiment of the disclosure, as shown in FIG. 2C, the operation that regulation processing is performed on the multiple copying parameters of the current coding block further includes that: the copying parameters are divided into bin parts using a CM and bin parts without the CM.

Figure 10:
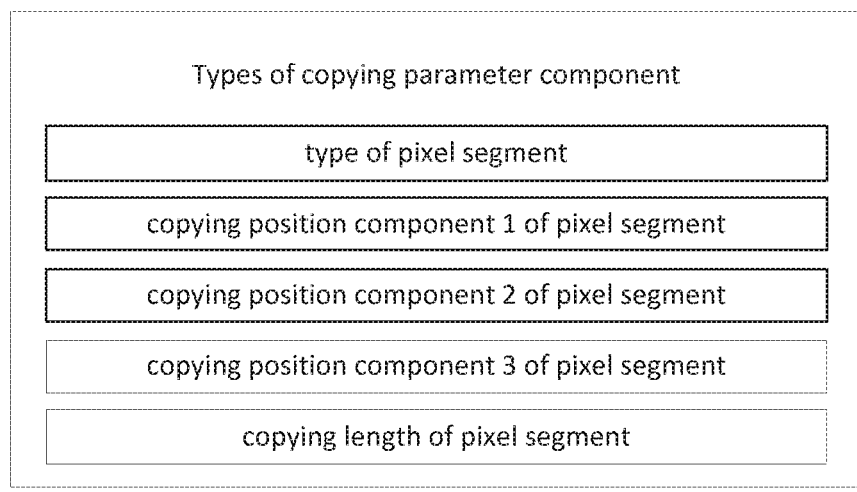
FIG. 10 is a diagram illustrating types of copying parameter component according to an embodiment of the disclosure.

In an implementation mode, a copying manner used for the coding block is a pixel string copying manner combined with a palette, and the following one or more types of copying parameter components included in each copying parameter are divided into the bin parts with the CM and the bin parts without the CM, as shown in FIG. 10:

a type of a pixel segment, a copying position component 1 of the pixel segment, a copying position component 2 of the pixel segment, a copying position component 3 of the pixel segment and a copying length of the pixel segment, where the type of the pixel segment is that whether a reference pixel is from the palette or not;

the copying position component 1 of the pixel segment is that, when the reference pixel is not from the palette, whether the reference pixel is at an ABOVE position or not (i.e. a position over a current pixel during horizontal scanning or a position on the left of the current pixel during vertical scanning);

the copying position component 2 of the pixel segment is a displacement vector horizontal component when the reference pixel is not from the palette and is not at the ABOVE position; and the copying position component 3 of the pixel segment is a displacement vector vertical component when the reference pixel is not from the palette and is not at the ABOVE position.

Figure 11:
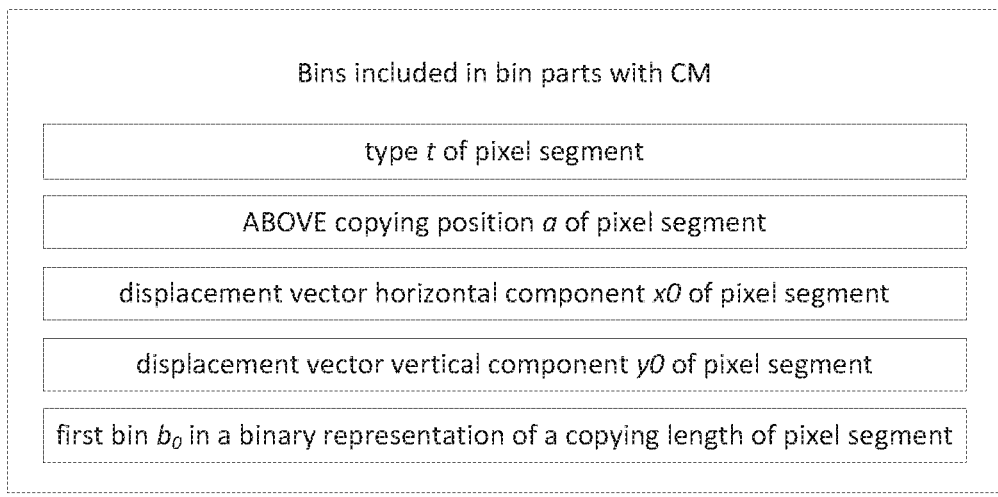
FIG. 11 is a diagram illustrating bins included in bin parts with the CM.

In an implementation mode, the copying manner used for the coding block is the pixel string copying manner combined with the palette; and when the copying parameters are divided into the bin parts with the CM and the bin parts without the CM, the bin parts with the CM include the following one or more bins, as shown in FIG. 11:

a type t of a pixel segment, where it is indicated that the reference pixel is from the palette when t adopts a first value, and it is indicated that the reference pixel is not from the palette when t adopts a second value;

an ABOVE copying position a of the pixel segment, where a exists when t indicates that the reference pixel is not from the palette, it is indicated that the reference pixel is at the ABOVE position when a adopts a third value, and it is indicated that the reference pixel is not at the ABOVE position when a adopts a fourth value;

a displacement vector horizontal component x0 of the pixel segment, where x0 exists when a indicates that the reference pixel is not at the ABOVE position, it is indicated that the displacement vector horizontal component is zero when x0 adopts a fifth value, and it is indicated that the displacement vector horizontal component is not zero when x0 adopts a sixth value;

a displacement vector vertical component y0 of the pixel segment, where y0 exists when a indicates that the reference pixel is not at the ABOVE position, it is indicated that the displacement vector vertical component is zero when y0 adopts a seventh value, and it is indicated that the displacement vector vertical component is not zero when y0 adopts an eighth value; and a first bin $b_0$ in a binary representation of a copying length of the pixel segment. Here, in the binary representation $b_0 b_1 b_2 \ldots$ of the copying length of the pixel segment, the first bin is $b_0$, and the other bits $b_1 b_2 \ldots$ are all in a bin part without the CM.

In an implementation mode, when the copying parameters are divided into the bin parts with the CM and the bin parts without the CM, the bin parts, with the CM of copying parameters are classified into a group, and the bin parts without the CM of the copying parameters are classified into another group, where entropy coding is sequentially performed on the two groups during entropy coding.

In an implementation mode, when the copying parameters are divided into the bin parts with the CM and the bin parts without the CM, entropy coding is performed on the copying parameter components of the same types in the bin parts with the CM in a centralized manner, and entropy coding is performed on the copying parameter components of the same types in the bin parts without the CM in the centralized manner.

In an implementation mode, when the copying parameters are divided into the bin parts with the CM and the bin parts without the CM, entropy coding is performed on all bins of the copying parameters with the copying parameter components of the same types in the bin parts with the CM in the centralized manner, and entropy coding is performed on all bins of the copying parameters with the copying parameter components of the same types in the bin parts without the CM in the centralized manner.

FIGS. 3A-3C are a first flowchart of an image decoding method according to an embodiment of the disclosure. In the embodiment of the disclosure, a video bitstream, at least including information of multiple copying parameters, of a current decoding block is parsed, and entropy decoding is performed on multiple copying parameters of one or more types of copying parameters according to an order of the copying parameters resulted from division, classification and reorganization. As shown in FIG. 3A, the image decoding method includes the following steps.

In Step 301, a video bitstream, including information of multiple copying parameters, of a decoding block is parsed, where the multiple copying parameters include one or more types of copying parameter components.

In Step 302, entropy decoding is performed on the multiple copying parameters to obtain bins of the multiple copying parameters, and a regulation operation is performed on the bins to obtain values of the multiple copying parameters.

In the solution of the embodiment of the disclosure, the decoding block is a decoding region of an image, and the decoding block includes at least one of: an LCU, a CTU, a CU, a sub-region of the CU, a PU and a TU, as shown in FIG. 9.

In the solution of the embodiment of the disclosure, as shown in FIG. 3B, the operation that the regulation operation is performed on the bins to obtain the values of the multiple copying parameters includes that:

the bins are divided into N subparts according to a predetermined rule, N≥2; and the bins in the subparts of the bins are classified, merged and mapped into reconstructed values of the multiple copying parameters, where each of the N subparts of the copying parameters are null or non-null.

In the solution of the embodiment of the disclosure, as shown in FIG. 3C, the bins are divided into bin parts with entropy decoding based on a CM and bin parts without entropy decoding based on the CM;

corresponding bins are extracted from the bin parts with entropy decoding based on the CM and/or the bin parts without entropy decoding based on the CM according to a corresponding table about CM for the bins corresponding to the copying parameters in an entropy decoding process to form the bins corresponding to the copying parameters; and the bins corresponding to the copying parameters are converted into the values of the copying parameters.

In an implementation mode, a copying manner used for the decoding block is a pixel string copying manner combined with a palette; and the bins corresponding to the following one or more types of copying parameters are divided into the bin parts with the CM and the bin parts without the CM, including, as shown in FIG. 10:

a type of a pixel segment, a copying position component 1 of the pixel segment, a copying position component 2 of the pixel segment, a copying position component 3 of the pixel segment and a copying length of the pixel segment.

In an implementation mode, the copying manner used for the decoding block is the pixel string copying manner combined with the palette, and when the bins corresponding to the copying parameters are divided into the bin parts with the CM and the bin parts without the CM, the bin parts with the CM include the following one or more bins, as shown in FIG. 11:

a type t of a pixel segment, where it is indicated that a reference pixel is from the palette when t adopts a first value, and it is indicated that the reference pixel is not from the palette when t adopts a second value;

an ABOVE copying position a of the pixel segment, where a exists when t indicates that the reference pixel is not from the palette, it is indicated that the reference pixel is at the ABOVE position when a adopts a third value, and it is indicated that the reference pixel is not at the ABOVE position when a adopts a fourth value;

a displacement vector horizontal component x0 of the pixel segment, where x0 exists when a indicates that the reference pixel is not at the ABOVE position, it is indicated that the displacement vector horizontal component is zero when x0 adopts a fifth value, and it is indicated that the displacement vector horizontal component is not zero when x0 adopts a sixth value;

a displacement vector vertical component y0 of the pixel segment, where y0 exists when a indicates that the reference pixel is not at the ABOVE position, it is indicated that the displacement vector vertical component is zero when y0 adopts a seventh value, and it is indicated that the displacement vector vertical component is not zero when y0 adopts an eighth value; and a first bin $b_0$ in a binary representation of a copying length of the pixel segment.

In an implementation mode, when the bins corresponding to the copying parameters are divided into the bin parts with the CM and the bin parts without the CM, entropy decoding is sequentially performed on the video bitstream corresponding to the bins, with the CM, of the copying parameters, and entropy decoding is performed on the video bitstream corresponding to the bin parts without the CM of the copying parameters;

the corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters; and the bins corresponding to the copying parameters are converted into the values of the copying parameters.

In an implementation mode, during entropy decoding, entropy decoding is sequentially performed on a group formed by the bin parts with the CM in the bins corresponding to the copying parameters and another group formed by the bin parts without the CM in the bins corresponding to the copying parameters;

when the bins corresponding to the copying parameters are divided into the bin parts with the CM and the bin parts without the CM, entropy decoding is performed on the bitstream corresponding to the bins of the copying parameter components of the same types in the bin parts with the CM, and entropy decoding is correspondingly performed on the bins of the copying parameter components of the same types in the bin parts without the CM;

the corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters; and the bins corresponding to the copying parameters are converted into the values of the copying parameters.

In an implementation mode, when the bins corresponding to the copying parameters are divided into the bin parts with the CM and the bin parts without the CM, entropy decoding is performed on the video bitstream corresponding to the bins of the copying parameters with the copying parameter components of the same types in the bin parts with the CM, and entropy decoding is performed on the video bitstream corresponding to the bins of the copying parameters with the copying parameter components of the same types in the bin parts without the CM;

the corresponding bins are extracted from the bin parts with entropy decoding based on the CM and/or the bin parts without entropy decoding based on the CM according to the corresponding table about CM for the bins corresponding to the copying parameters in the entropy decoding process to form the bins corresponding to the copying parameters; and the bins corresponding to the copying parameters are converted into the values of the copying parameters.

Figure 4:
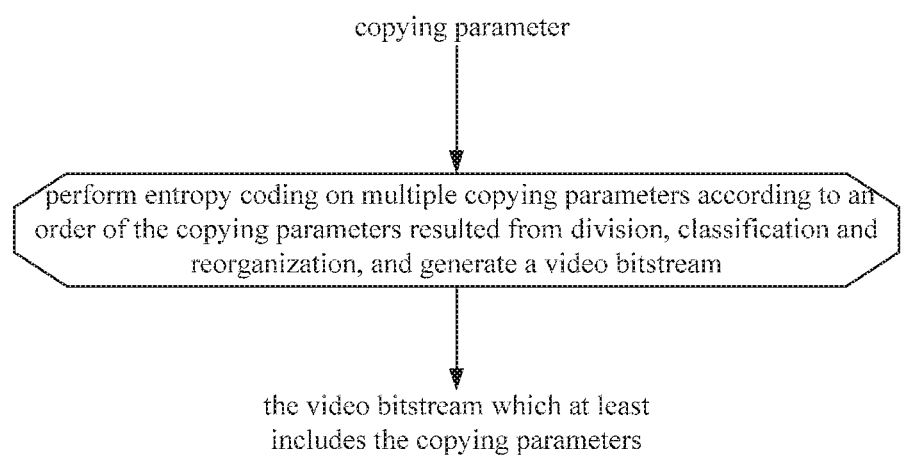
FIG. 4 is a second flowchart of an image coding method according to an embodiment of the disclosure.

FIG. 4 is a second flowchart of an image decoding method according to an embodiment of the disclosure. As shown in FIG. 4, in the flow:

entropy coding is performed on multiple copying parameters of one or more types of copying parameters of a current coding block according to an order of the copying parameters resulted from division, classification and reorganization, and a video bitstream at least including information of the multiple copying parameters is generated.

Figure 5:
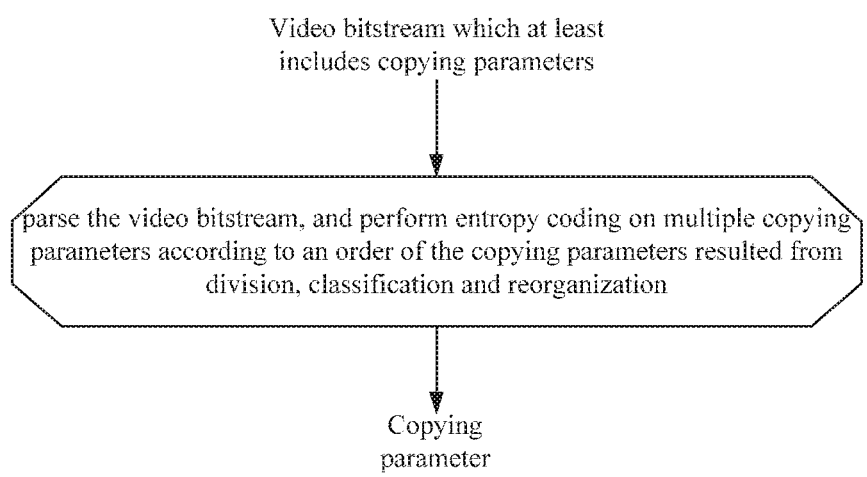
FIG. 5 is a second flowchart of an image decoding method according to an embodiment of the disclosure.

FIG. 5 is a second flowchart of an image decoding method according to an embodiment of the disclosure. As shown in FIG. 5, in the flow:

a video bitstream, at least including information of multiple copying parameters, of a current decoding block is parsed, and entropy decoding is performed on the multiple copying parameters of one or more types of copying parameters according to a sequence obtained by division, classification and reorganization.

Figure 6:
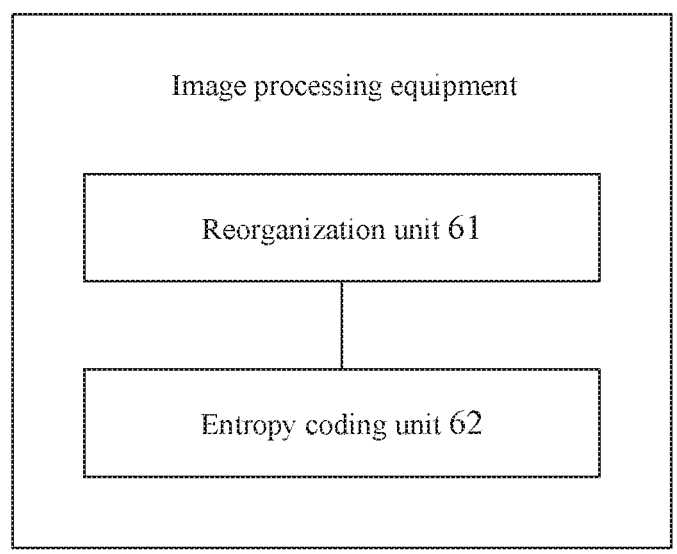
FIG. 6 is a first structure diagram of image processing equipment according to an embodiment of the disclosure.

FIG. 6 is a first structure diagram of image processing equipment according to an embodiment of the disclosure. The image processing equipment may code an image. As shown in FIG. 6, the image processing equipment includes:

a reorganization unit 61, configured to perform regulation processing on multiple copying parameters of a current coding block; and an entropy coding unit 62, configured to perform entropy coding on the copying parameters according to an order of the copying parameters resulted from regulation processing, and generate a video bitstream including information of the multiple copying parameters, where the multiple copying parameters include one or more types of copying parameter components.

Those skilled in the art should know that a function realized by each unit in the image processing equipment shown in FIG. 6 may be understood with reference to the related descriptions of the image coding method. The function of each unit in the image processing equipment shown in FIG. 6 may be realized through a program running on a processor, and may also be realized through a specific logic circuit.

During a practical application, the function realized by each unit in the image processing equipment may be realized through a Central Processing Unit (CPU), or Micro Processor Unit (MPU), Digital Signal Processor (DSP), Field Programmable Gate Array (FPGA) and the like located in the image processing equipment.

Figure 7:
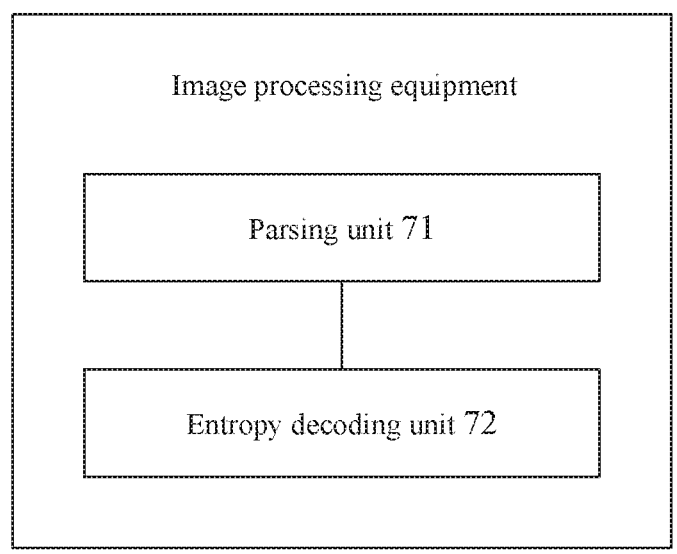
FIG. 7 is a second structure diagram of image processing equipment according to an embodiment of the disclosure.

FIG. 7 is a second structure diagram of image processing equipment according to an embodiment of the disclosure. The image processing equipment may decode an image. As shown in FIG. 7, the image processing equipment includes:

a parsing unit 71, configured to parse a video bitstream, including information of multiple copying parameters, of a decoding block; and an entropy decoding unit 72, configured to perform entropy decoding on the multiple copying parameters to obtain bins of the multiple copying parameters, and perform a regulation operation on the bins to obtain values of the multiple copying parameters, where the multiple copying parameters include one or more types of copying parameter components.

Those skilled in the art should know that a function realized by each unit in the image processing equipment shown in FIG. 7 may be understood with reference to the related descriptions of the image coding method. The function of each unit in the image processing equipment shown in FIG. 7 may be realized through a program running on a processor, and may also be realized through a specific logic circuit.

During a practical application, the function realized by each unit in the image processing equipment may be realized through a CPU, or MPU, DSP, FPGA and the like located in the image processing equipment.

Figure 8:
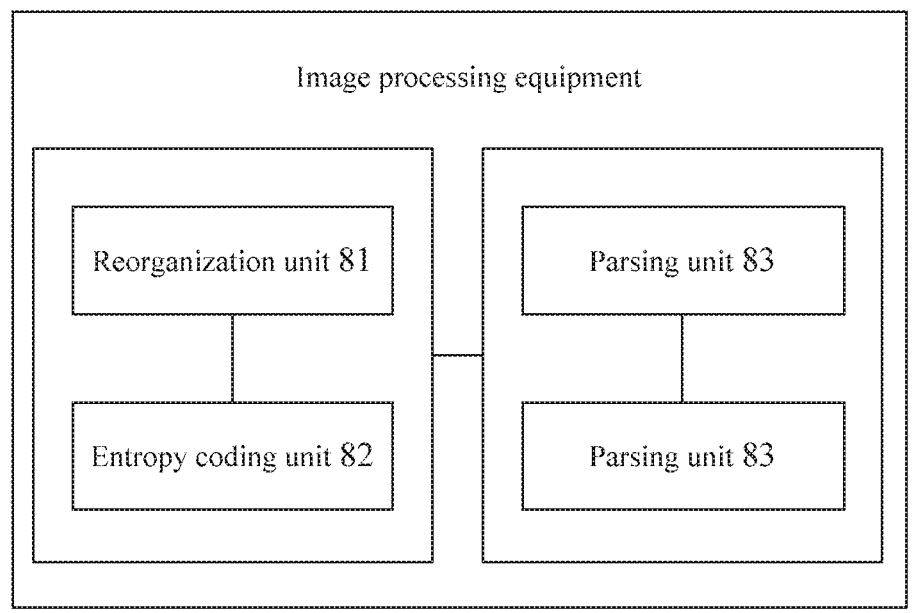
FIG. 8 is a third structure diagram of image processing equipment according to an embodiment of the disclosure.

FIG. 8 is a third structure diagram of image processing equipment according to an embodiment of the disclosure. The image processing equipment may code and decode an image. As shown in FIG. 8, the image processing equipment includes:

a reorganization unit 81, configured to perform regulation processing on multiple copying parameters of a current coding block; and an entropy coding unit 82, configured to perform entropy coding on the copying parameters according to an order of the copying parameters resulted from regulation processing, and generate a video bitstream including information of the multiple copying parameters, where the multiple copying parameters include one or more types of copying parameter components.

A parsing unit 83 is configured to parse a video bitstream, including information of multiple copying parameters, of a decoding block; and an entropy decoding unit 84 is configured to perform entropy decoding on the multiple copying parameters to obtain bins of the multiple copying parameters, and perform a regulation operation on the bins to obtain values of the multiple copying parameters, where the multiple copying parameters include one or more types of copying parameter components.

During a practical application, a function realized by each unit in the image processing equipment may be realized through a CPU, or MPU, DSP, FPGA and the like located in the image processing equipment.

Those skilled in the art should know that the embodiment of the disclosure may be provided as a method, a system or a computer program product. Therefore, the disclosure may adopt a form of hardware embodiment, software embodiment or combined software and hardware embodiment. Moreover, the disclosure may adopt a form of computer program product implemented on one or more computer-available storage media (including, but not limited to, a disk memory and an optical memory) including computer-available program codes.

When being implemented in form of software function module and sold or used as an independent product, the image processing equipment of the embodiments of the disclosure may also be stored in a computer-readable storage medium. Based on such an understanding, the technical solutions of the embodiments of the disclosure substantially or parts making contributions to a conventional art may be embodied in form of software product, and the computer software product is stored in a storage medium, including a plurality of instructions configured to enable computer equipment (which may be a personal computer, a server, network equipment or the like) to execute all or part of the methods in each embodiment of the disclosure. The above-mentioned storage medium includes: various media capable of storing program codes such as a U disk, a mobile hard disk, a Read-Only Memory (ROM), a magnetic disk or an optical disk. Therefore, the embodiments of the disclosure are not limited to any specific hardware and software combination.

Correspondingly, the embodiments of the disclosure further provide a computer storage medium, in which a computer program is stored, the computer program being configured to execute an image coding method and/or image decoding method of the embodiments of the disclosure.

The disclosure is described with reference to flowcharts and/or block diagrams of the method, equipment (system) and computer program product according to the embodiment of the disclosure. It should be understood that each flow and/or block in the flowcharts and/or the block diagrams and combinations of the flows and/or blocks in the flowcharts and/or the block diagrams may be implemented by computer program instructions. These computer program instructions may be provided for a universal computer, a dedicated computer, an embedded processor or a processor of other programmable data processing equipment to generate a machine, so that a device for realizing a function specified in one flow or more flows in the flowcharts and/or one block or more blocks in the block diagrams is generated by the instructions executed through the computer or the processor of the other programmable data processing equipment.

These computer program instructions may also be stored in a computer-readable memory capable of guiding the computer or the other programmable data processing equipment to work in a specific manner, so that a product including an instruction device may be generated by the instructions stored in the computer-readable memory, the instruction device realizing the function specified in one flow or many flows in the flowcharts and/or one block or many blocks in the block diagrams.

These computer program instructions may further be loaded onto the computer or the other programmable data processing equipment, so that a series of operating steps are executed on the computer or the other programmable data processing equipment to generate processing implemented by the computer, and steps for realizing the function specified in one flow or many flows in the flowcharts and/or one block or many blocks in the block diagrams are provided by the instructions executed on the computer or the other programmable data processing equipment.

The above is only the preferred embodiment of the disclosure and not intended to limit the scope of protection of the disclosure.

INDUSTRIAL APPLICABILITY

According to the solutions of the embodiments of the disclosure, regulation processing is performed on the multiple copying parameters of the current coding block; and entropy coding is performed on the copying parameters according to the an order of the copying parameters resulted from regulation processing, and the video bitstream including the information of the multiple copying parameters is generated, where the multiple copying parameters include the one or more types of copying parameter components. The video bitstream, including the information of the multiple copying parameters, of the decoding block is parsed; entropy decoding is performed on the multiple copying parameters to obtain the bins of the multiple copying parameters; and the regulation operation is performed on the bins to obtain the values of the multiple copying parameters, where the multiple copying parameters include the one or more types of copying parameter components. Influence of an interleaving method on multi-bit parallel entropy coding and entropy decoding processing of the copying parameters is avoided, and an entropy coding and entropy decoding throughput is improved.

The invention claimed is:

1. An image coding method, comprising:
performing a regulation processing on a plurality of copying parameters of a current coding block; and
performing an entropy coding on the plurality of the copying parameters according to an order of the plurality of the copying parameters that results from the regulation processing, and generating a video bitstream comprising the plurality of the copying parameters,
wherein the plurality of the copying parameters comprise one or more types of copying parameter components,
wherein the one or more types of copying parameter components comprises at least one of a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length, or an unmatched pixel,
wherein performing the regulation processing on the plurality of the copying parameters of the current coding block comprises:
dividing the plurality of the copying parameters into N subparts according to a predetermined rule, N≥2; and
classifying, merging and re-sequencing same subparts of the plurality of the copying parameters; and then performing the entropy coding on the same subparts sequentially,
wherein each of the N subparts of the plurality of the copying parameters is null or non-null.

2. The image coding method according to claim 1, wherein the current coding block is a coding region of an image, and the current coding block comprises at least one of: a Largest Coding Unit (LCU), a Coding Tree Unit (CTU), a Coding Unit (CU), a sub-region of the CU, a Prediction Unit (PU) or a Transform Unit (TU).

3. The image coding method according to claim 1, wherein performing the regulation processing on the plurality of the copying parameters of the current coding block further comprises:
dividing the plurality of the copying parameters into bin parts with a Context Model (CM) and bin parts without the CM.

4. The image coding method according to claim 3, wherein a copying manner used for the current coding block is a pixel string copying manner combined with a palette, and
one or more types of following copying parameter components comprised in the plurality of the copying parameters are divided into the bin parts with the CM and the bin parts without the CM:
a type of a pixel segment, a copying position component 1 of the pixel segment, a copying position component 2 of the pixel segment, a copying position component 3 of the pixel segment and a copying length of the pixel segment,
wherein the pixel segment is a partition of the current coding block and comprises a copying parameter of the plurality of the copying parameters,
wherein the pixel string copying manner performs an operation to copy a reference string from a reconstructed reference pixel sample set for a coding string in the current block and assign a numerical value of the reference string.

5. The image coding method according to claim 3, wherein a copying manner used for the current coding block is a pixel string copying manner combined with a palette; and
when the plurality of the copying parameters are divided into the bin parts with the CM and the bin parts without the CM, the bin parts with the CM comprise one or more of following bins:
a type t of a pixel segment, wherein it is indicated that a reference pixel is from the palette when t adopts a first value; and it is indicated that the reference pixel is not from the palette when t adopts a second value;
an ABOVE copying position a of the pixel segment, wherein a exists when t indicates that the reference pixel is not from the palette, it is indicated that the reference pixel is at the ABOVE position when a adopts a third value, and it is indicated that the reference pixel is not at the ABOVE position when a adopts a fourth value;
a displacement vector horizontal component x0 of the pixel segment, wherein x0 exists when a indicates that the reference pixel is not at the ABOVE position, it is indicated that the displacement vector horizontal component of the pixel is zero when x0 adopts a fifth value, and it is indicated that the displacement vector horizontal component of the pixel segment is not zero when x0 adopts a sixth value;
a displacement vector vertical component y0 of the pixel segment, wherein y0 exists when a indicates that the reference pixel is not at the ABOVE position, it is indicated that the displacement vector vertical component of the pixel segment is zero when y0 adopts a seventh value, and it is indicated that the displacement vector vertical component of the pixel segment is not zero when y0 adopts an eighth value; and
a first bin $b_0$ in a binary representation of a copying length of the pixel segment,
wherein the pixel segment is a partition of the current coding block and comprises a copying parameter of the plurality of the copying parameters,
wherein the pixel string copying manner performs an operation to copy a reference string from a reconstructed reference pixel sample set for a coding string in the current block and assign a numerical value of the reference string.

6. The image coding method according to claim 3, further comprising:
when the plurality of the copying parameters are divided into the bin parts with the CM and the bin parts without the CM, classifying the bin parts with the CM of the plurality of the copying parameters into a group; and classifying the bin parts without the CM of the plurality of the copying parameters into another group,
wherein the entropy coding is sequentially performed on two groups.

7. The image coding method according to claim 3, further comprising:

when the plurality of the copying parameters are divided into the bin parts with the CM and the bin parts without the CM, performing the entropy coding on the copying parameter components of a same type in the bin parts with the CM in a centralized manner such that the entropy coding is performed sequentially, and performing the entropy coding on the copying parameter components of a same type in the bin parts without the CM in the centralized manner.

8. The image coding method according to claim 3, further comprising:
when the plurality of the copying parameters are divided into the bin parts with the CM and the bin parts without the CM, performing the entropy coding on all bins of the plurality of the copying parameters with the copying parameter components of a same type in the bin parts with the CM in a centralized manner such that the entropy coding is performed sequentially, and performing the entropy coding on all bins of the plurality of the copying parameters with the copying parameter components of a same type in the bin parts without the CM in the centralized manner.

9. An image decoding method, comprising:
parsing a video bitstream comprising a plurality of copying parameters, of a decoding block;
performing an entropy decoding on the plurality of the copying parameters to obtain bins of the plurality of the copying parameters; and
performing a regulation operation on the bins to obtain values of the plurality of the copying parameters,
wherein the plurality of the copying parameters comprise one or more types of the copying parameter components;
wherein the one or more types of copying parameter components comprises at least one of a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length, or an unmatched pixel;
wherein performing the regulation operation on the bins to obtain the values of the plurality of the copying parameters comprises:
dividing the bins into N subparts according to a predetermined rule, N≥2; and
classifying, merging and mapping bins in the N subparts of the bins into reconstructed values of the plurality of the copying parameters,
wherein each of the N subparts of the plurality of the copying parameters is null or non-null.

10. The image decoding method according to claim 9, wherein the decoding block is a decoding region of an image, and the decoding block comprises at least one of: a Largest Coding Unit (LCU), a Coding Tree Unit (CTU), a Coding Unit (CU), a sub-region of the CU, a Prediction Unit (PU) or a Transform Unit (TU).

11. The image decoding method according to claim 9, further comprising:
dividing the bins into bin parts with the entropy decoding based on a Context Model (CM) and bin parts without the entropy decoding based on the CM;
extracting corresponding bins from at least one of the bin parts with the entropy decoding based on the CM or the bin parts without the entropy decoding with the CM according to a corresponding table about the CM for the bins of the plurality of the copying parameters in an entropy decoding process, to form the bins of the plurality of the copying parameters; and
converting the bins of the plurality of the copying parameters into the values of the plurality of the copying parameters.

12. The image decoding method according to claim 11, wherein a copying manner used for the decoding block is a pixel string copying manner combined with a palette; and
the bins corresponding to following one or more types of the copying parameters are divided into the bin parts with the CM and the bin parts without the CM, comprising:
a type of a pixel segment, a copying position component 1 of the pixel segment, a copying position component 2 of the pixel segment, a copying position component 3 of the pixel segment and a copying length of the pixel segment,
wherein the pixel segment is a partition of the current coding block and comprises a copying parameter of the plurality of the copying parameters,
wherein the pixel string copying manner performs an operation to copy a reference string from a reconstructed reference pixel sample set for a coding string in the current block and assign a numerical value of the reference string.

13. The image decoding method according to claim 11, wherein a copying manner used for the decoding block is a pixel string copying manner combined with a palette, and
when the bins of the plurality of the copying parameters are divided into the bin parts with the CM and the bin parts without the CM, the bin parts with the CM comprise the following one or more bins:
a type t of a pixel segment, wherein it is indicated that a reference pixel is from the palette when t adopts a first value, and it is indicated that the reference pixel is not from the palette when t adopts a second value;
an ABOVE copying position a of the pixel segment, wherein a exists when t indicates that the reference pixel is not from the palette, it is indicated that the reference pixel is at the ABOVE position when a adopts a third value, and it is indicated that the reference pixel is not at the ABOVE position when a adopts a fourth value;
a displacement vector horizontal component x0 of the pixel segment, wherein x0 exists when a indicates that the reference pixel is not at the ABOVE position, it is indicated that the displacement vector horizontal component of the pixel segment is zero when x0 adopts a fifth value, and it is indicated that the displacement vector horizontal component of the pixel segment is not zero when x0 adopts a sixth value;
a displacement vector vertical component y0 of the pixel segment, wherein y0 exists when a indicates that the reference pixel is not at the ABOVE position, it is indicated that the displacement vector vertical component of the pixel segment is zero when y0 adopts a seventh value, and it is indicated that the displacement vector vertical component of the pixel segment is not zero when y0 adopts an eighth value; and
a first bin $b_0$ in a binary representation of a copying length of the pixel segment,
wherein the pixel segment is a partition of the current coding block and comprises a copying parameter of the plurality of the copying parameters, wherein the pixel string copying manner performs an operation to copy a reference string from a reconstructed reference pixel sample set for a coding string in the current block and assign a numerical value of the reference string.

14. The image decoding method according to claim 11, further comprising:
when the bins of the plurality of the copying parameters are divided into the bin parts with the CM and the bin parts without the CM, sequentially performing the entropy decoding on the video bitstream corresponding to the bins with the CM of the plurality of the copying parameters, and performing the entropy decoding on the video bitstream corresponding to the bin parts without the CM of the plurality of the copying parameters;
extracting the corresponding bins from at least one of the bin parts with the entropy decoding based on the CM or the bin parts without the entropy decoding based on the CM according to the corresponding table about the CM for the bins of the plurality of the copying parameters in the entropy decoding process to form the bins of the plurality of the copying parameters; and
converting the bins of the plurality of the copying parameters into the values of the plurality of the copying parameters.

15. The image decoding method according to claim 11, further comprising:
during the entropy decoding, sequentially performing the entropy decoding on a group formed by the bin parts with the CM in the bins of the plurality of the copying parameters and another group formed by the bin parts without the CM in the bins of the plurality of the copying parameters;
when the bins of the plurality of the copying parameters are divided into the bin parts with the CM and the bin parts without the CM, performing the entropy decoding on a bitstream corresponding to the bins of the copying parameter components of a same type in the bin parts with the CM, and correspondingly performing the entropy decoding on the bins of the copying parameter components of a same type in the bin parts without the CM;
extracting the corresponding bins from at least one of the bin parts with the entropy decoding based on the CM or the bin parts without the entropy decoding based on the CM according to the corresponding table about the CM for the bins of the plurality of the copying parameters in the entropy decoding process to form the bins of the plurality of the copying parameters; and
converting the bins of the plurality of the copying parameters into the values of the plurality of the copying parameters.

16. The image decoding method according to claim 11, further comprising:
when the bins of the plurality of the copying parameters are divided into the bin parts with the CM and the bin parts without the CM, performing the entropy decoding on the video bitstream corresponding to the bins of the plurality of the copying parameters with the copying parameter components of a same type in the bin parts with the CM, and performing the entropy decoding on the video bitstream corresponding to the bins of the plurality of the copying parameters with the copying parameter components of a same type in the bin parts without the CM;

extracting the corresponding bins from at least one of the bin parts with the entropy decoding based on the CM or the bin parts without the entropy decoding based on the CM according to the corresponding table about the CM for the bins of the plurality of the copying parameters in the entropy decoding process to form the bins of the plurality of the copying parameters; and
converting the bins of the plurality of the copying parameters into the values of the plurality of the copying parameters.

17. An image processing equipment, comprising a processor and a memory for storing a set of instructions executable for the processor, wherein when the instructions are executed by the processor, the processor is arranged to:
perform a regulation processing on a plurality of copying parameters of a current coding block; and
perform an entropy coding on the plurality of the copying parameters according to an order of the plurality of the copying parameters that results from the regulation processing, and generate a video bitstream comprising the plurality of the copying parameters,
wherein the plurality of the copying parameters comprise one or more types of copying parameter components,
wherein the one or more types of copying parameter components comprises at least one of a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length, or an unmatched pixel, and
wherein the processor is further arranged to:
divide the plurality of the copying parameters into N subparts according to a predetermined rule, N≥2; and
classify, merge and re-sequence same subparts of the plurality of the copying parameters; and then perform the entropy coding on the same subparts sequentially,
wherein each of the N subparts of the plurality of the copying parameters is null or non-null.

18. An image processing equipment, comprising a processor and a memory for storing a set of instructions executable for the processor, wherein when the instructions are executed by the processor, the processor is arranged to:
parse a video bitstream comprising a plurality of copying parameters, of a decoding block; and
perform an entropy decoding on the plurality of the copying parameters to obtain bins of the plurality of the copying parameters, and perform a regulation operation on the bins to obtain values of the plurality of the copying parameters,
wherein the plurality of the copying parameters comprise one or more types of copying parameter components,
wherein the one or more types of copying parameter components comprises at least one of a displacement vector horizontal component, a displacement vector vertical component, a one-dimensional displacement vector, a linear address, a relative linear address, an index, a palette linear address, a relative index, a palette relative linear address, a copying length, a copying width, a copying height, a rectangle width, a rectangle length, or an unmatched pixel, and
wherein the processor is further arranged to:
divide the bins into N subparts according to a predetermined rule, N≥2; and classify, merge and map bins in the N subparts of the bins into reconstructed values of the plurality of the copying parameters, wherein each of the N subparts of the plurality of the copying parameters is null or non-null.

* * * * *